(12) United States Patent
Chen et al.

(10) Patent No.: US 12,230,632 B2
(45) Date of Patent: Feb. 18, 2025

(54) INTEGRATED CIRCUIT LAYOUT AND METHOD THEREOF

(71) Applicant: TAIWAN SEMICONDUCTOR MANUFACTURING CO., LTD., Hsinchu (TW)

(72) Inventors: Chien-Yuan Chen, Hsinchu (TW); Hau-Tai Shieh, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 458 days.

(21) Appl. No.: 17/025,917

(22) Filed: Sep. 18, 2020

(65) Prior Publication Data

US 2022/0093587 A1    Mar. 24, 2022

(51) Int. Cl.
*H01L 27/088* (2006.01)
*H01L 21/8234* (2006.01)

(52) U.S. Cl.
CPC .. *H01L 27/0886* (2013.01); *H01L 21/823418* (2013.01); *H01L 21/823431* (2013.01); *H01L 21/823456* (2013.01)

(58) Field of Classification Search
CPC ..... H01L 21/823418; H01L 21/823431; H01L 21/823456; H01L 21/823468; H01L 21/823475; H01L 21/823481; H01L 21/814; H01L 21/823821; H01L 21/82385; H01L 21/823864; H01L 21/823871; H01L 21/823878; H01L 27/0207; H01L 27/088; H01L 27/0886; H01L 27/0822; H01L 27/0924; H01L 21/823814; H01L 21/823842
See application file for complete search history.

(56) References Cited

U.S. PATENT DOCUMENTS

| | | | |
|---|---|---|---|
| 9,461,044 B1 * | 10/2016 | Chang | H01L 21/823481 |
| 9,748,144 B1 * | 8/2017 | Lin | H01L 21/823456 |
| 11,295,055 B2 | 4/2022 | Chien et al. | |

(Continued)

FOREIGN PATENT DOCUMENTS

| | | | | |
|---|---|---|---|---|
| CN | 113889469 | * | 1/2022 | ..... H01L 21/823431 |
| JP | 2011155275 A | | 8/2011 | |

(Continued)

OTHER PUBLICATIONS

Ambhorkar, P. et al. "Nanowire-Based Biosensors: From Growth to Applications", Micromachines, 2018, 9, 679.

*Primary Examiner* — Mary A Wilczewski
(74) *Attorney, Agent, or Firm* — Maschoff Brennan

(57) ABSTRACT

An integrated circuit (IC) structure includes a first transistor and a second transistor. The first transistor includes a first active region and a first gate disposed on the first active region, in which the first gate has a first effective gate length along a first direction parallel to a lengthwise direction of the first active region. The second transistor includes a second active region and a second gate disposed on the second active region, and includes a plurality of gate structures arranged along the first direction and separated from each other, in which the second gate has a second effective gate length along the first direction, the second effective gate length is n times the first effective gate length, and n is a positive integer greater than 1.

20 Claims, 39 Drawing Sheets

(56) References Cited

U.S. PATENT DOCUMENTS

| | | | |
|---|---|---|---|
| 2012/0043595 A1 | 2/2012 | Chang et al. | |
| 2012/0180016 A1 | 7/2012 | Chidambaram et al. | |
| 2013/0175611 A1* | 7/2013 | Shinohara | H01L 21/823857 257/334 |
| 2014/0070320 A1* | 3/2014 | Mukherjee | H01L 27/0886 438/585 |
| 2014/0367754 A1* | 12/2014 | Morisaki | H01L 29/6656 438/533 |
| 2015/0060995 A1 | 3/2015 | Sakamoto et al. | |
| 2016/0056292 A1* | 2/2016 | Ho | H01L 21/324 438/283 |
| 2016/0148832 A1* | 5/2016 | Leobandung | H01L 29/6656 438/283 |
| 2016/0181244 A1* | 6/2016 | Peng | H01L 27/0922 438/285 |
| 2016/0293493 A1* | 10/2016 | Fan | H01L 27/0924 |
| 2016/0315165 A1* | 10/2016 | Lee | H01L 29/42364 |
| 2017/0125301 A1* | 5/2017 | Ho | H01L 21/02164 |
| 2017/0194209 A1* | 7/2017 | Li | H01L 21/823456 |
| 2017/0194210 A1* | 7/2017 | Oh | H01L 21/02282 |
| 2017/0200803 A1* | 7/2017 | Lee | H01L 29/785 |
| 2018/0033790 A1* | 2/2018 | Li | H01L 27/0924 |
| 2018/0182756 A1* | 6/2018 | Lee | H01L 27/1104 |
| 2018/0286962 A1* | 10/2018 | Bao | H01L 29/6659 |
| 2018/0330995 A1* | 11/2018 | Dou | H01L 21/823431 |
| 2018/0358272 A1* | 12/2018 | Togo | H01L 21/823821 |
| 2019/0088762 A1* | 3/2019 | Su | H01L 29/4966 |
| 2019/0179993 A1 | 6/2019 | Chou et al. | |
| 2019/0371674 A1* | 12/2019 | Wu | H01L 21/82385 |
| 2020/0007135 A1 | 1/2020 | Sharma et al. | |
| 2020/0058748 A1* | 2/2020 | Bae | H01L 27/0886 |
| 2020/0152461 A1* | 5/2020 | Kim | H01L 21/823431 |
| 2020/0258787 A1* | 8/2020 | Wang | H01L 29/4966 |
| 2020/0328119 A1* | 10/2020 | Lim | H01L 27/0886 |
| 2021/0036120 A1* | 2/2021 | Yang | H01L 21/76224 |
| 2021/0358865 A1* | 11/2021 | Tokranov | H01L 23/4824 |
| 2022/0093587 A1* | 3/2022 | Chen | H01L 27/0886 |
| 2022/0271031 A1* | 8/2022 | Teng | H01L 21/823456 |
| 2022/0285220 A1* | 9/2022 | Lim | H01L 27/0886 |
| 2022/0302114 A1* | 9/2022 | Chuang | H01L 29/6656 |

FOREIGN PATENT DOCUMENTS

| | | |
|---|---|---|
| JP | 2015050332 A | 3/2015 |
| KR | 20070047635 A | 5/2007 |
| KR | 20090031841 A | 3/2009 |
| KR | 20120023198 A | 3/2012 |
| KR | 20200028869 A | 3/2020 |
| TW | 201250996 A | 12/2012 |

* cited by examiner

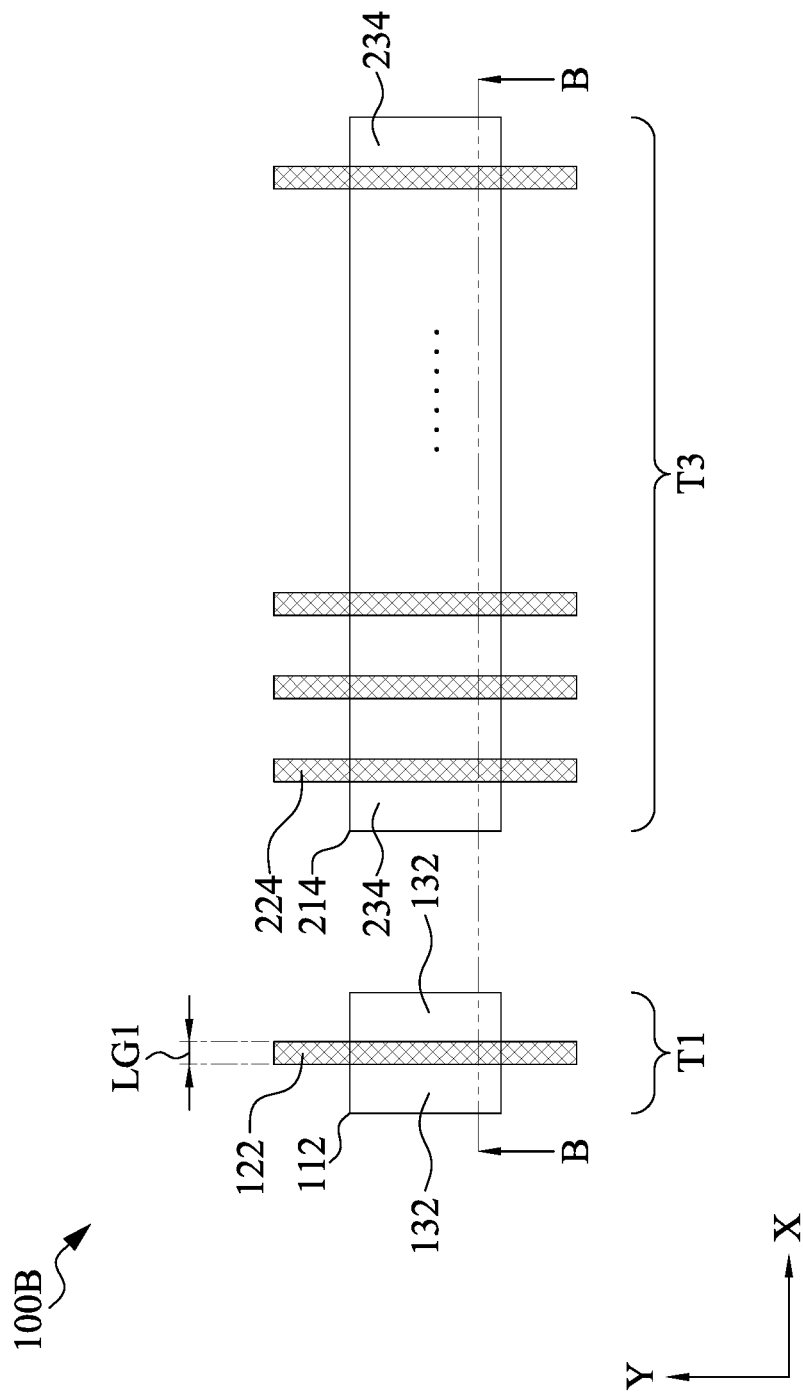

| 821A | 822A | 823A |
| 826A | 825A | 824A |
| 827A | 828A | 829A |

Fig. 8D

| 921A | 922A | 923A |
|---|---|---|
| 926A | 925A | 924A |
| 927A | 928A | 929A |

Fig. 9D

INTEGRATED CIRCUIT LAYOUT AND METHOD THEREOF

BACKGROUND

As integrated circuits become smaller, layouts for the integrated circuits are changed to decrease the overall area occupied by an integrated circuit. Decreasing the area of the layout is accomplished by substituting new structures for integrated circuit elements that are smaller than previous versions of integrated circuit elements. Decreasing the area of the layout is also accomplished by reducing the distance between circuit elements in a layer of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B illustrate a top view and a cross-sectional view of an integrated circuit in accordance with some embodiments of the present disclosure.

FIG. 8D is a block diagram of an integrated circuit in accordance with some embodiments of the present disclosure.

FIG. 9D is a block diagram of an integrated circuit in accordance with some embodiments of the present disclosure.

DETAILED DESCRIPTION

Figure 1A:
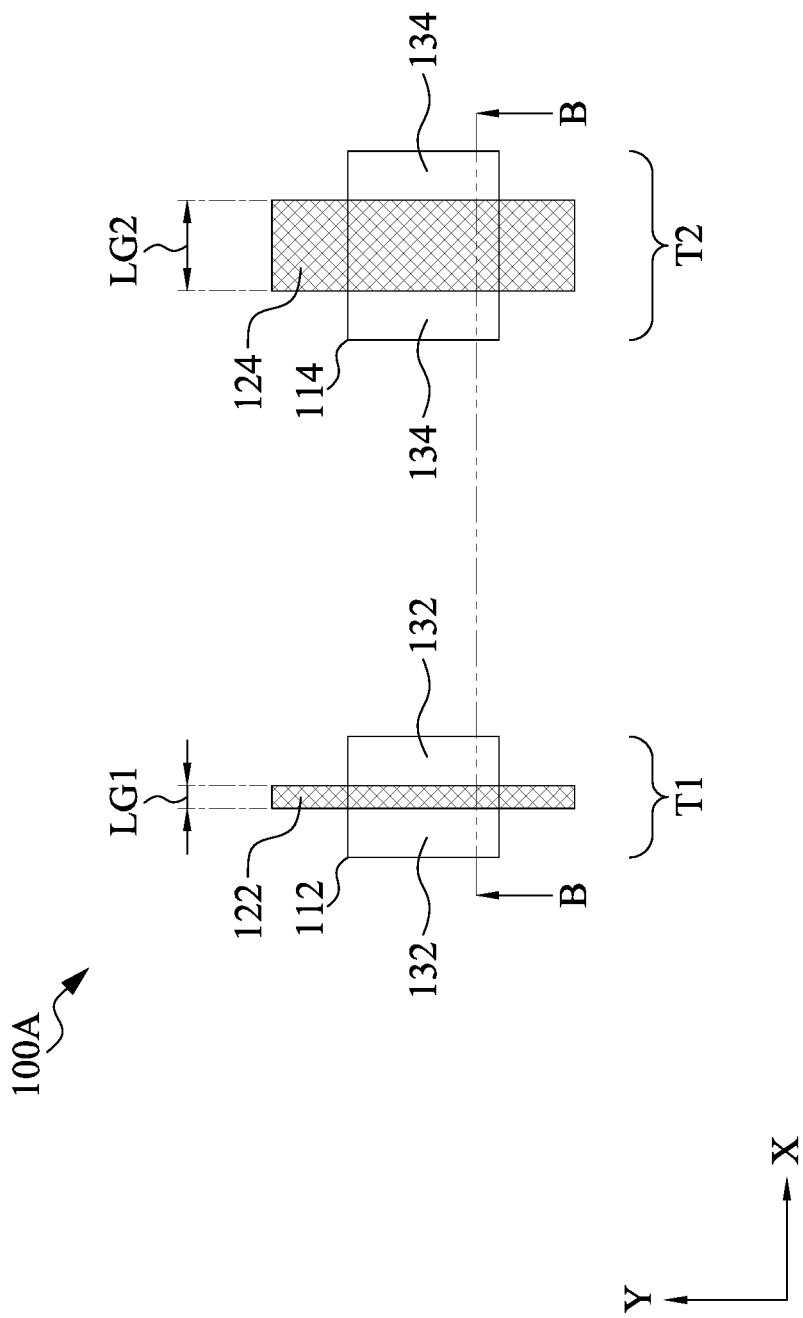
FIGS. 1A and 1B illustrate a top view and a cross-sectional view of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) are components of some integrated circuits. A FET includes a channel region and also a source region and a drain region (collectively referred to source/drain regions) spaced apart by the channel region. A gate electrode is over the channel region. By applying a voltage to the gate electrode, the conductivity of the channel region increases to allow current to flow from the source region to the drain region. A FET utilizes conductive a gate contact that electrically connects to the gate electrode to apply the gate voltage to the FET, and source/drain contacts that electrically connect to source/drain regions to conduct current to and from the FET.

Figure 1B:
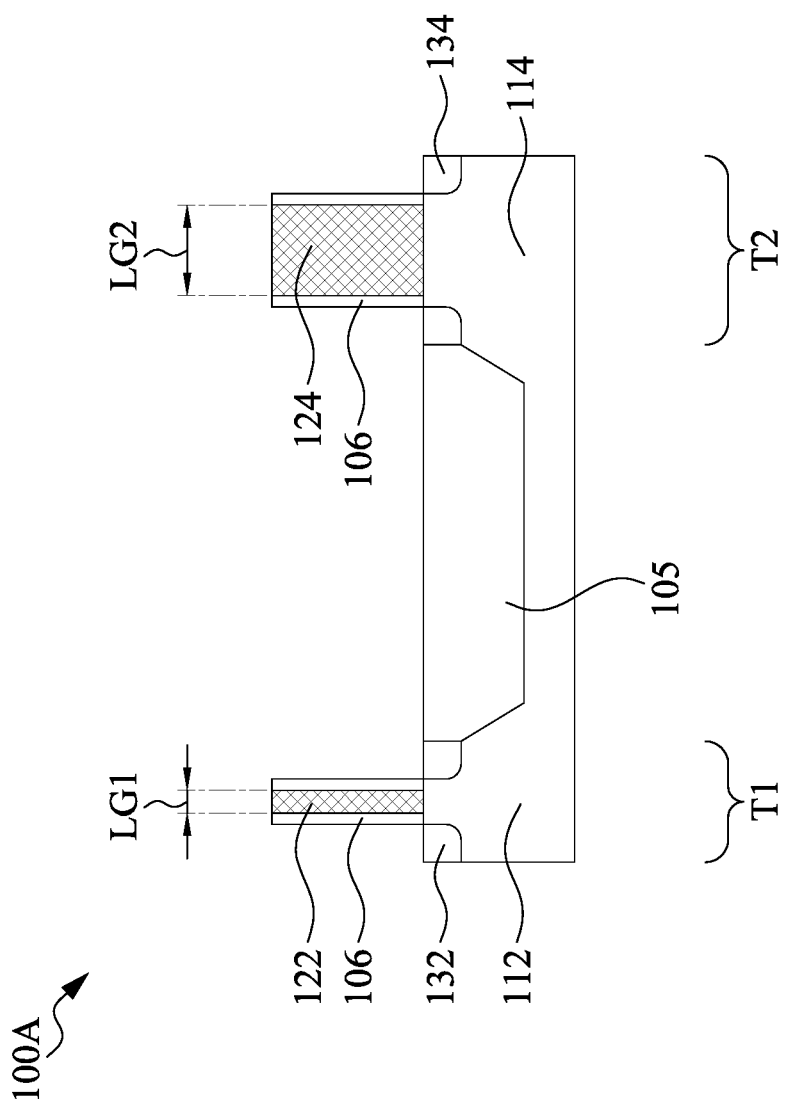
Figure 1C:
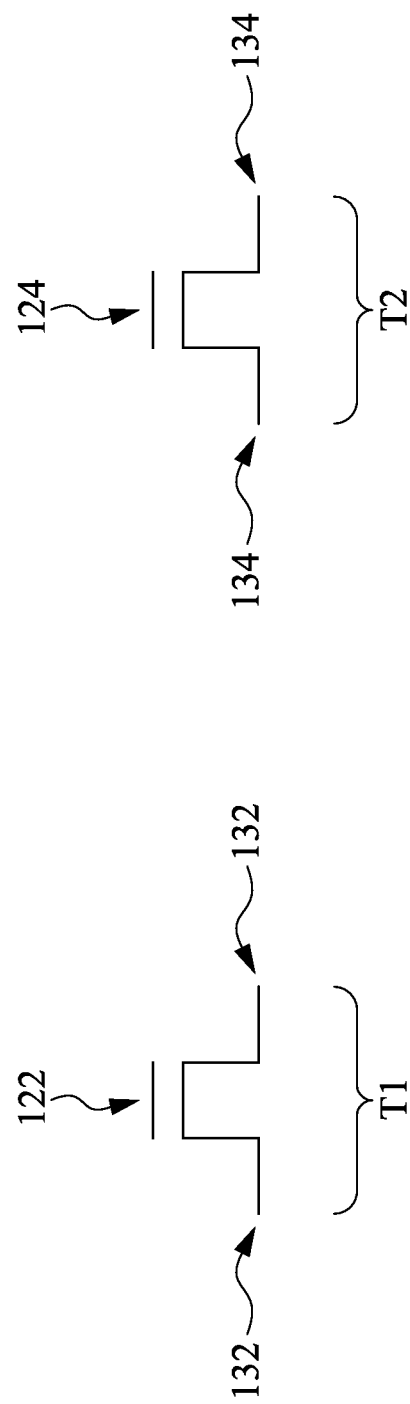
FIG. 1C illustrates an equivalent circuit of FIGS. 1A and 1B.

FIGS. 1A, 1B, and 1C illustrate an integrated circuit 100A in accordance with some embodiments of the present disclosure, in which FIG. 1A is a top view of the integrated circuit 100A, and FIG. 1B is a cross-sectional view along line B-B of FIG. 1A. FIG. 1C illustrates an equivalent circuit of the integrated circuit 100A as shown in FIGS. 1A and 1B.

The integrated circuit 100A includes a first transistor T1 and a second transistor T2. The first transistor T1 includes an active region 112, and the second transistor T2 includes an active region 114. The active regions 112 and 114 extend along the X direction. Here, the X direction is the lengthwise direction of the active regions 112 and 114, and the Y direction is the lengthwise direction of the gate structures 122 and 124, in which the X direction is vertical to the Y direction. In some embodiments, the active regions 112 and 114 are arranged along the X direction, while the embodiments of the present disclosure are not limited thereto. In some embodiments, the active regions 112 and 114 may protrude from a substrate and may be separated by a plurality of isolation structures made of oxide, which provide electrical isolation between different active regions. Accordingly, the active regions 112 and 114 may also be referred to as oxide definition (OD) regions in some embodiments. For example, in FIG. 1B, the active regions 112 and 114 are separated at least by an isolation structure 105. In some embodiments, the isolation structure 105 is a shallow trench isolation (STI) structure formed by, for example, etching one or more trenches in the substrate, depositing one or more dielectric materials (e.g., silicon oxide) into the one or more trenches, followed by a CMP process to level the deposited one or more dielectric materials with the substrate.

The active region 112 of first transistor T1 includes a source region and a drain region, in which the source region and the drain region are collectively referred to as source/drain regions 132. Similarly, the active region 114 of second transistor T2 includes a source region and a drain region, in which the source region and the drain region are collectively referred to as source/drain regions 134.

The first transistor T1 includes a gate structure 122 over and crossing the active region 112. Similarly, the second transistor T2 includes a gate structure 124 over and crossing the active region 114. In FIG. 1B, a plurality of gate spacers 106 are disposed on opposite sidewalls of the gate structures 122 and 124, respectively.

The gate structure 122 of the first transistor T1 has a gate length LG1 and the gate structure 124 of the second transistor T2 has a gate length LG2. Here, the "gate length" denotes a length (or width, depending on the perspective) of the gate structures 122 and/or 124 measured in the X-direction. The gate lengths LG1 and LG2 are different from each other. The gate length LG2 is greater than the gate length LG1. A channel region is defined as an overlapping region between a gate structure and an active region. As the gate length LG1 of the first transistor T1 is less than the gate length LG2 of the second transistor T2, the channel length of the first transistor T1 is less than the channel length of the second transistor T2. Accordingly, the first transistor T1 can be referred to as a short channel device, and the second transistor T2 can be referred to as a long channel device. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 . . . ).

In some embodiments, the gate length LG1 is the smallest gate length in the integrated circuit 100A. In some embodiments, the gate length LG1 of the gate structure 122 is the critical dimension (CD) in a technology node (e.g., 10 nm node, 7 nm node, 5 nm node, 3 nm node or beyond). Here, the term "critical dimension" is a smallest (or minimum) dimension of a pattern feature, such as the gate lengths LG1 and LG2. The critical dimension contributes to overall pattern layout size and pattern layout density. In the depicted embodiments, each feature of the pattern (such as the gate structures 122 and/or 124) has a dimension or size, such as a length along the X direction. Each feature may have a dimension that is greater than or equal to the critical dimension of the pattern. As described above, the gate length LG1 is the critical dimension. That is, the gate length LG1 of the gate structure 122 of the first transistor T1 is a smallest (or minimum) gate length of a gate structure in a corresponding technology node. As the gate length LG2 is greater than the gate length LG1, the gate length LG2 is greater than the critical dimension.

In some embodiments, a long channel device, such as the second transistor T2, may be used as a transistor in a header circuit, as a long channel device can save leakage in the header circuit. In some other embodiments, a long channel device, such as the second transistor T2, may be used as an NMOS device in a skew invertor. In a skew invertor, if a PMOS device in the skew invertor is designed to have a higher strength than a NMOS device in the skew invertor, the NMOS device can be a long channel device and the PMOS device can be a short channel device. For example, the NMOS device of the skew invertor can be the second transistor T2 described herein, and the PMOS device of the skew invertor can be the first transistor T1 described herein. In yet some other embodiments, a long channel device, such as the second transistor T2, may be used as a transistor in a variation tolerance circuit, because a long channel can provide less variation. Here, the variation tolerance circuit may include a sense amplifier in a memory device, a comparator in an analog-to-digital converter (ADC), or the like.

The active regions 112 and 114 may formed over a substrate including, but not limited to, a bulk silicon substrate, a silicon-on-insulator (SOI) substrate, or a silicon geranium substrate. Other semiconductor materials including group III, group IV, and group V elements are within the scope of various embodiments. For example, the active regions 112 and 114 may be formed by, for example, patterning a substrate using photolithography and etching techniques. In some embodiments, the active regions 112 and 114 are electrically isolated from each other by an isolation structure (not shown). In some embodiments, the isolation structure is a shallow trench isolation (STI) structure including a trench filled with one or more dielectric material. In some embodiments, the STI structure includes silicon dioxide, silicon nitride, silicon oxynitride, or any other suitable insulating materials.

The source/drain regions 132 and 134 are doped semiconductor regions located on opposite sides of the corresponding gate structures 122 and 124. In some embodiments, the source/drain regions 132 and 134 include p-type dopants such as boron for formation of p-type FETs. In other embodiments, the source/drain regions 132 and 134 include n-type dopants such as phosphorus for formation of n-type FETs.

In some embodiments, the source/drain regions 132 and 134 may be epitaxially grown regions. For example, gate spacers 106 may be formed alongside dummy gate structures (which will be replaced with the final gate structures 122 and 124) by depositing a spacer material and anisotropically etching the spacer material, and subsequently, the source/drain regions 132 and 134 are formed self-aligned to the gate spacers 106 by first etching the active regions 112 and 114 to form recesses, and then depositing a crystalline semiconductor material in the recess by a selective epitaxial growth (SEG) process that may fill the recesses in the active regions 112 and 114 and may extend further beyond the original surface of the active regions 112 and 114 to form raised source/drain epitaxy structures in some embodiments. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like.

The gate structures 122 and 124 extend along the Y direction across the active regions 112 and 114, respectively. In some embodiments, the gate structures 122 and 124 are high-k metal gate (HKMG) gate structures that may be formed using a gate-last process flow (interchangeably referred to as gate replacement flow). In a gate-last process flow, sacrificial dummy gate structures (e.g., polysilicon gate, not shown) are formed over the active regions 112 and 114, respectively. Each of the dummy gate structures may include a dummy gate dielectric, a dummy gate electrode (e.g., polysilicon gate), and a hard mask. First a dummy gate dielectric material (e.g., silicon oxide, silicon nitride, or the like) may be deposited. Next a dummy gate material (e.g., polysilicon) may be deposited over the dummy gate dielectric and then planarized (e.g., by CMP). A hard mask layer (e.g., silicon nitride, silicon carbide, or the like) may be formed over the dummy gate material. The dummy gate structures are then formed by patterning the hard mask layer and transferring that pattern to the dummy gate dielectric and dummy gate material using suitable photolithography and etching techniques. After forming the source/drain regions 132 and 134, the dummy gate structures are replaced by the HKMG gate structures 122 and 124 as illustrated herein. The materials used to form the dummy gate structures and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In some embodiments, each of the HKMG gate structures 122 and 124 includes a high-k gate dielectric material, a work function metal layer, and a filling metal. Exemplary high-k gate dielectric materials include, but are not limited to, silicon nitride, silicon oxynitride, hafnium oxide ($HfO_2$), $LaHfO_x$, $ZrO_2$, hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the HKMG gate structures 122 and 124 may also include interfacial layers between the high-k gate dielectric material and the active regions 112 and 114, respectively. The interfacial layers may include SiO2, SiON, or the like.

Exemplary work function metal layer includes TiN (for PMOS), TiAl (for NMOS), or the like. In some embodiments, the work function metal layer may include Rb, Eu, Sr, Ba, Sm, Tb, Y, Nd, La, Sc, Lu, Mg, Tl, Hf, Al, Mn, Zr, Bi, Pb, Ta, Ag, V, Zn, Ti, Nb, Sn, W, Cr, Fe, Mo, Cu, Ru, Sb, Os, TaN, TiN/TaN, Ta/Si/N, Te, Re, Rh, Be, Co, Au, Pd, Ni, Ir, Pt, Se.

Exemplary filling metals includes, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), or molybdenum nitride (MoN).

In some embodiments, the gate spacers 106 may be made of or may include $SiO_2$, $Si_3N_4$, $SiO_xN_y$, SiC, SiCN films, SiOC, SiOCN films, and/or combinations thereof. The gate spacers 106 may be formed by, for example, depositing a dielectric layer over the dummy gate structures (as discussed above), and followed by an etching process to remove horizontal portions of the dielectric material. In some embodiments, the HKMG gate structures 122 and 124 may also include barrier layer between the work function metal layer and the filling metal. The barrier layer may include TiN, TaN, Ti, Co, or the like.

Figure 2B:
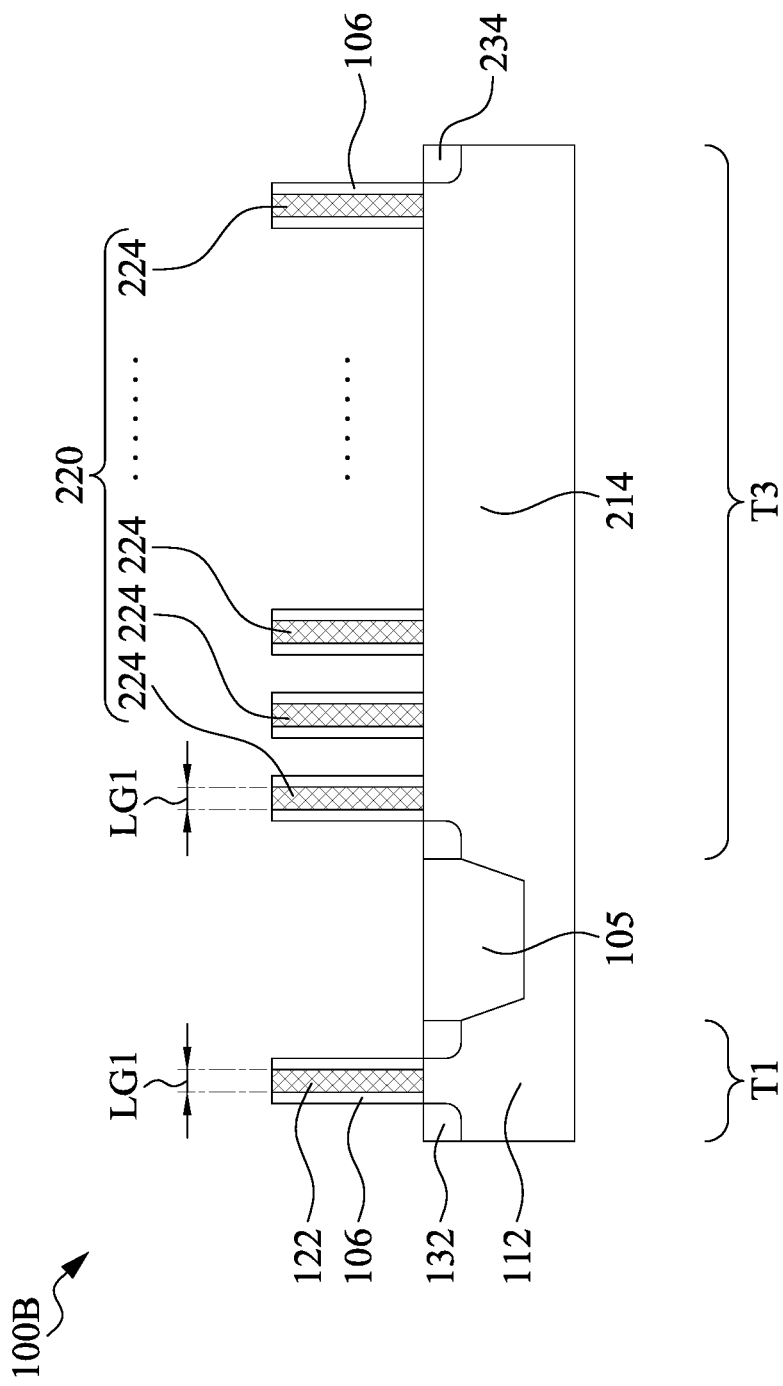
Figure 2C:
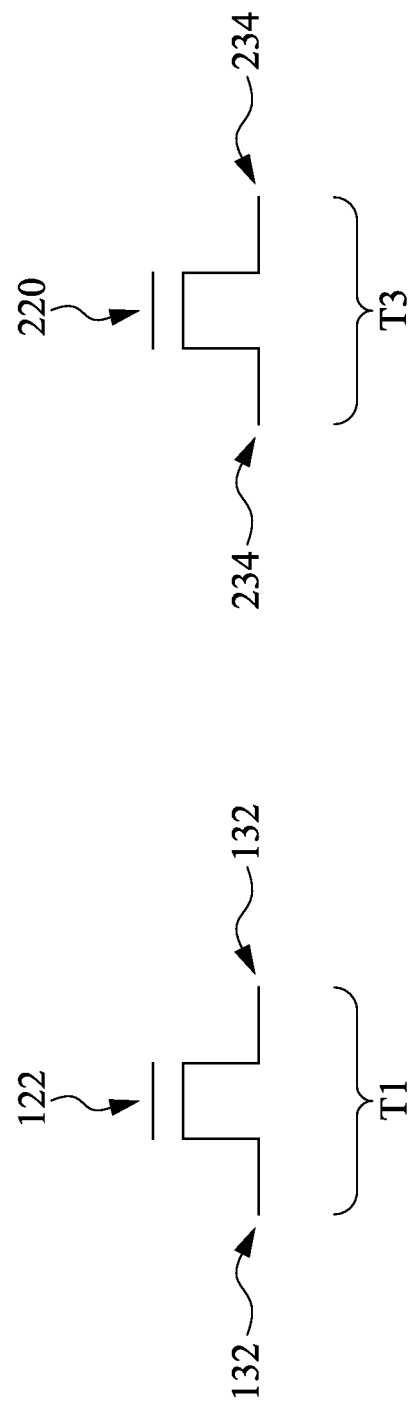
FIG. 2C illustrates an equivalent circuit of FIGS. 2A and 2B.

FIGS. 2A, 2B, and 2C illustrate an integrated circuit 100B in accordance with some embodiments of the present disclosure, in which FIG. 2A is a top view of the integrated circuit 100B, and FIG. 2B is a cross-sectional view along line B-B of FIG. 2A. FIG. 2C illustrates an equivalent circuit of the integrated circuit 100B as shown in FIGS. 2A and 2B. Some elements of FIGS. 2A, 2B, and 2C are similar to those described in FIGS. 1A, 1B, and 1C, and thus relevant details will not be repeated for brevity.

The integrated circuit 100B includes a first transistor T1 and a second transistor T3. The first transistor T1 described in FIGS. 2A, 2B, and 2C is the same as the first transistor T1 described in FIGS. 1A, 1B, and 1C. It is worth noted that the gate length LG1 of the first transistor T1 is a critical dimension in a corresponding technology node.

The second transistor T3 has an active region 214. The active region 214 extends along the X direction. The second transistor T3 includes a plurality of gate structures 224 disposed on the active region 214. In some embodiments, each of the gate structures 224 has a gate length LG1. That is, each of the gate structures 224 of the second transistor T3 has the same gate length as the gate structure 122 of the first transistor T1, in which the gate length LG1 is a critical dimension in a corresponding technology node. In some embodiments, gate spacers 106 are disposed on opposite sidewalls of each of the gate structures 224.

In some embodiments, the gate structures 224 are electrically connected (e.g., by one or more metal lines and one or more vias in a back-end-of-line (BEOL) interconnect structure, not shown) and can thus be collectively referred to as a gate 220, in which the gate 220 serves as the gate of the transistor T3. In some embodiments, the gate structures 224 are electrically connected to the same voltage node. Stated another way, the gate 220 of the transistor T3 can be regarded as having several segments (e.g., gate structures 224) arranged along the X direction, in which each segment has spacers 106 disposed on its opposite sidewalls. As mentioned above, each of the gate structures 224 has a gate length LG1. Accordingly, if the number of the gate structures 224 is n, the effective gate length of the gate 220 of the transistor T3 is n*LG1, in which n is a positive integer that is greater than 1. Accordingly, the first transistor T1 can be referred to as a short channel device, and the second transistor T3 can be referred to as a long channel device.

The transistor T3 has a plurality of source/drain regions 234 disposed in the active region 214. In greater detail, the source/drain regions 234 are disposed on opposite sides of the gate 220 of the transistor T3. That is, the source/drain regions 234 are disposed adjacent to the outmost gate structures 224. As an example in FIGS. 2A and 2B, one source/drain region 234 is disposed adjacent to the rightmost gate structure 224, and another one source/drain region 234 is disposed adjacent to the leftmost gate structure 224. It is noted that, in some embodiments, there is no source/drain region between any two adjacent gate structures 224 of transistor T3. In other words, portions of the active region 214 between any two adjacent gate structures 224 are un-doped or less-doped, in which the dopant concentration of these portions is less than the dopant concentration of the source/drain regions 234. In practice, a first voltage and a second voltage may be applied respectively to the source/drain regions 234, and a third voltage may be applied to the gate 220 to operate the transistor T3. That is, a single voltage (e.g., the third voltage described herein) is applied to the gate structures 224.

Figure 3A:
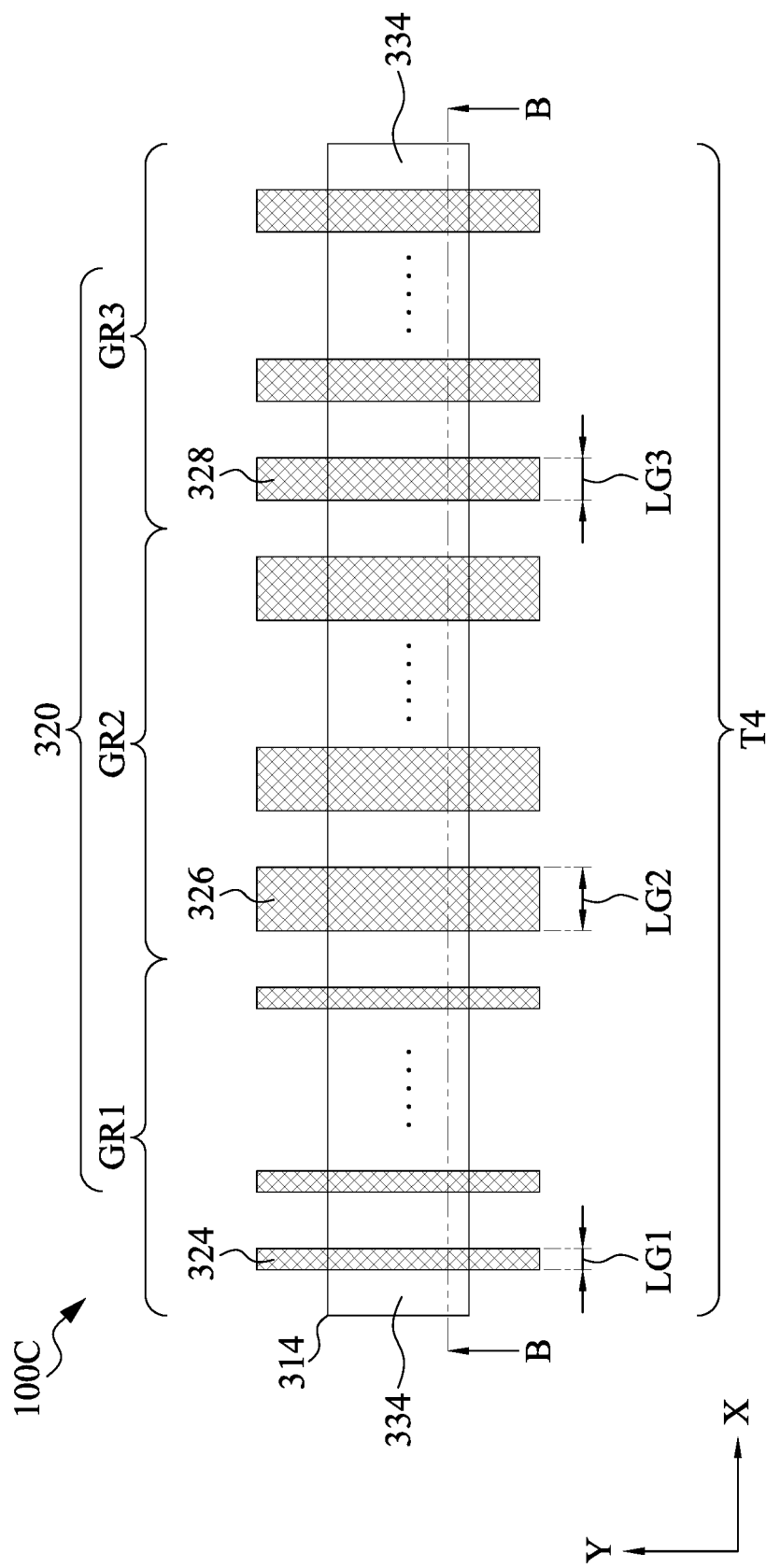
FIGS. 3A and 3B illustrate a top view and a cross-sectional view of an integrated circuit in accordance with some embodiments of the present disclosure.
Figure 3B:
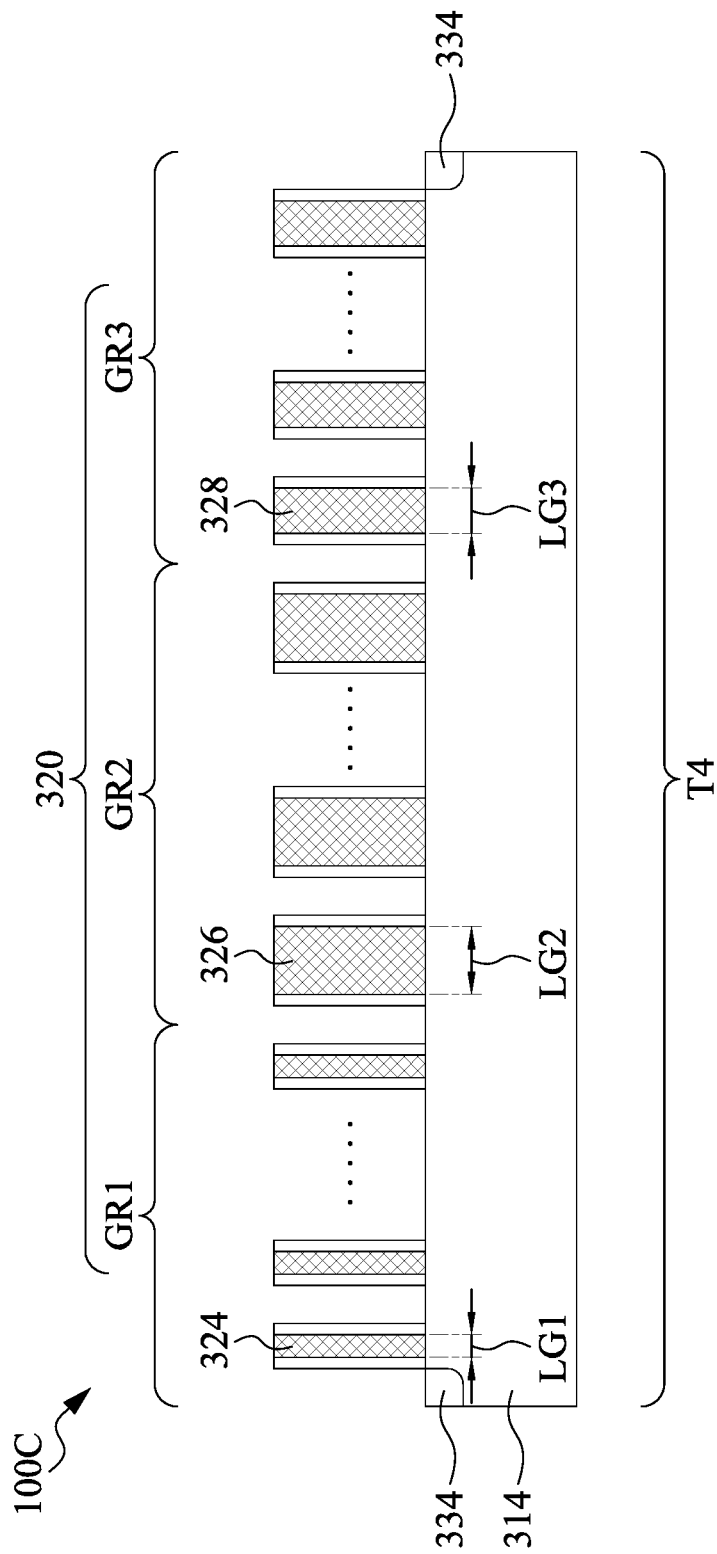
Figure 3C:
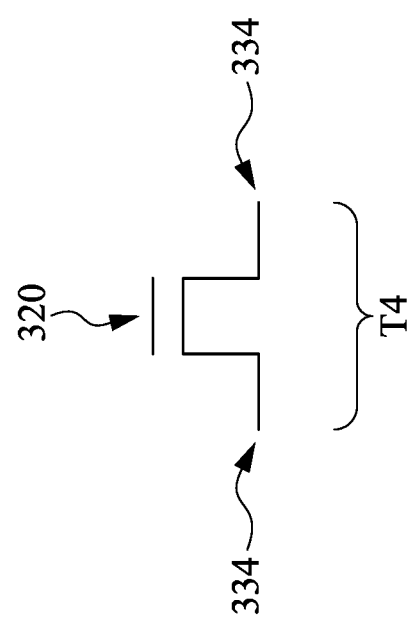
FIG. 3C illustrates an equivalent circuit of FIGS. 3A and 3B.

FIGS. 3A, 3B, and 3C illustrate an integrated circuit 100C in accordance with some embodiments of the present disclosure, in which FIG. 3A is a top view of the integrated circuit 100C, and FIG. 3B is a cross-sectional view along line B-B of FIG. 3A. FIG. 3C illustrates an equivalent circuit of the integrated circuit as shown in FIGS. 3A and 3B. Some elements of FIGS. 3A, 3B, and 3C are similar to those described in FIGS. 1A, 1B, and 1C, and thus relevant details will not be repeated for brevity.

The integrated circuit 100C includes a transistor T4. Although not shown in FIGS. 3A to 3C, the integrated circuit 100C may include a transistor T1 as described in FIGS. 1A to 1C. It is worth noted that the gate length LG1 of the first transistor T1 is a critical dimension in a corresponding technology node.

The transistor T4 has an active region 314. The active region 314 extends along the X direction. The transistor T4 includes a plurality of gate structures 324, a plurality of gate structures 326, and a plurality of gate structures 328 disposed on the active region 314. In some embodiments, the number of the gate structures 324 may be x, the number of the gate structures 326 may be y, and the number of the gate structures 328 may be z, in which x, y, z are positive integers. In some embodiments, each of the gate structures 324 has a gate length LG1, in which the gate length LG1 is a critical dimension in a corresponding technology node. Each of the gate structures 326 has a gate length LG2 greater than the gate length LG1 of the gate structures 324. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 . . . ). On the other hand, each of the gate structures 328 has a gate length LG3 greater than the gate length LG1 of the gate structures 324. In some embodiments, the gate length LG2 is m times the gate length LG1, in which m is a positive integer. That is, LG3=m*LG1, in which m is a positive integer. In some embodiments, m is a positive integer and is greater than 1 (e.g., m=2, 3, 4 . . . ). In the embodiments of FIGS. 3A to 3C, n is greater than m. For example, n may be 3, and m may be 2, while the present disclosure is not limited thereto.

The gate structures 324 form a first group GR1, the gate structures 326 form a second group GR2, and the gate structures 328 form a third group GR3. In some embodiments, each of the groups GR1, GR2, and GR3 includes at least one gate structure having substantially the same gate length, while the gate length of one group is different from the gate lengths of other groups. In some embodiments, the groups Gr1, GR2, and GR3 are sequentially arranged along the X direction. In some embodiments, the gate structures 324, 326, and 328 are electrically connected (e.g., by one or more metal lines and one or more vias in a BEOL interconnect structure, not shown) and can thus be collectively referred to as a gate 320, in which the gate 320 serves as the gate of the transistor T4. In some embodiments, the gate structures 324, 326, and 328 are electrically connected to the same voltage node. From another view point, the gate 320 of the transistor T4 can be regarded as having several segments (e.g., gate structures 324, 326, and 328) arranged along the X direction, in which each segment has spacers 106 disposed on its opposite sidewalls. Also, the segments can be divided into several groups (e.g., groups GR1, GR2, and GR3), in which the segments in each group has substantially the same gate length.

As mentioned above, the numbers of gate structures 324, 326, and 328 are x, y, and z, respectively, in which x, y, z are positive integers. Accordingly, the effective gate length of the gate 320 of the transistor T4 is x*LG1+y*LG2+z*LG3. From another view point, because gate length LG2 of gate structures 326 can be expressed as n*LG1, and the gate length LG3 of gate structures 328 can be expressed as m*LG1. Accordingly, the effective gate length of the gate 320 of the transistor T4 can also be expressed as x*LG1+y*n*LG1+z*m*LG1, namely (x+y*n+z*m)*LG1. Because x, y, z, n, m are all positive integers, the term x+y*n+z*m is also a positive integer. That is, the effective gate length of the gate 320 of the transistor T4 is multiple times (e.g., x+y*n+z*m times) the gate length LG1 having a critical dimension. As a result, the transistor T4 can be referred to as a long channel device. It is noted that the integrated circuit 100C of FIGS. 3A to 3C may also include a short channel device, such as the transistor T1 described in FIGS. 1A to 1C.

The transistor T4 has a plurality of source/drain regions 334 disposed in the active region 314. In greater detail, the source/drain regions 334 are disposed on opposite sides of the gate 320 of the transistor T4. That is, the source/drain regions 334 are disposed adjacent to the outmost gate structures. As an example in FIGS. 3A and 3B, one source/drain region 334 is disposed adjacent to the leftmost gate structure 324, and another one source/drain region 334 is disposed adjacent to the rightmost gate structure 328. It is noted that, in some embodiments, there is no source/drain region between any two adjacent gate structures 324, 326, and 328 of the transistor T4. In other words, portions of the active region 314 between any two adjacent gate structures 324, 326, and 328 are un-doped or less-doped, in which the dopant concentration of these portions is less than the dopant concentration of the source/drain regions 334. In practice, a first voltage and a second voltage may be applied respectively to the source/drain regions 334, and a third voltage may be applied to the gate 320 to operate the transistor T4. That is, a single voltage (e.g., the third voltage described herein) is applied to the gate structures 324, 326, and 328.

Figure 4A:
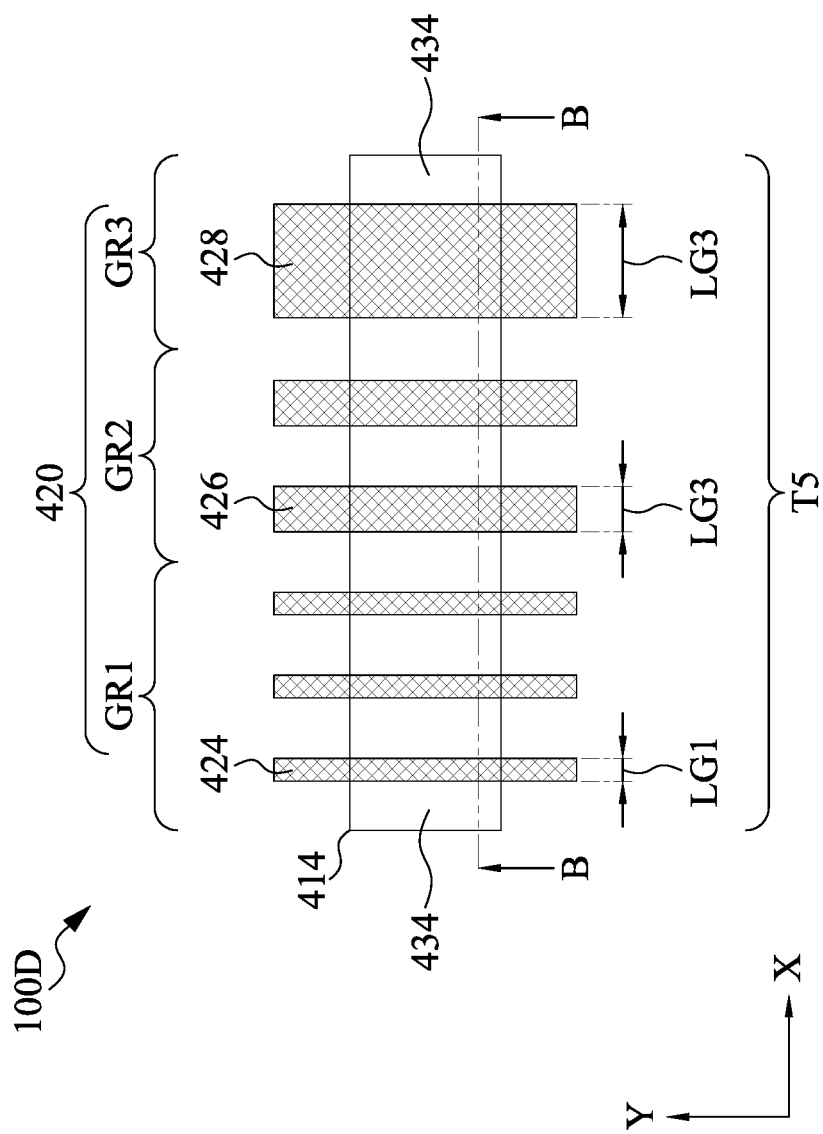
FIGS. 4A and 4B illustrate a top view and a cross-sectional view of an integrated circuit in accordance with some embodiments of the present disclosure.
Figure 4B:
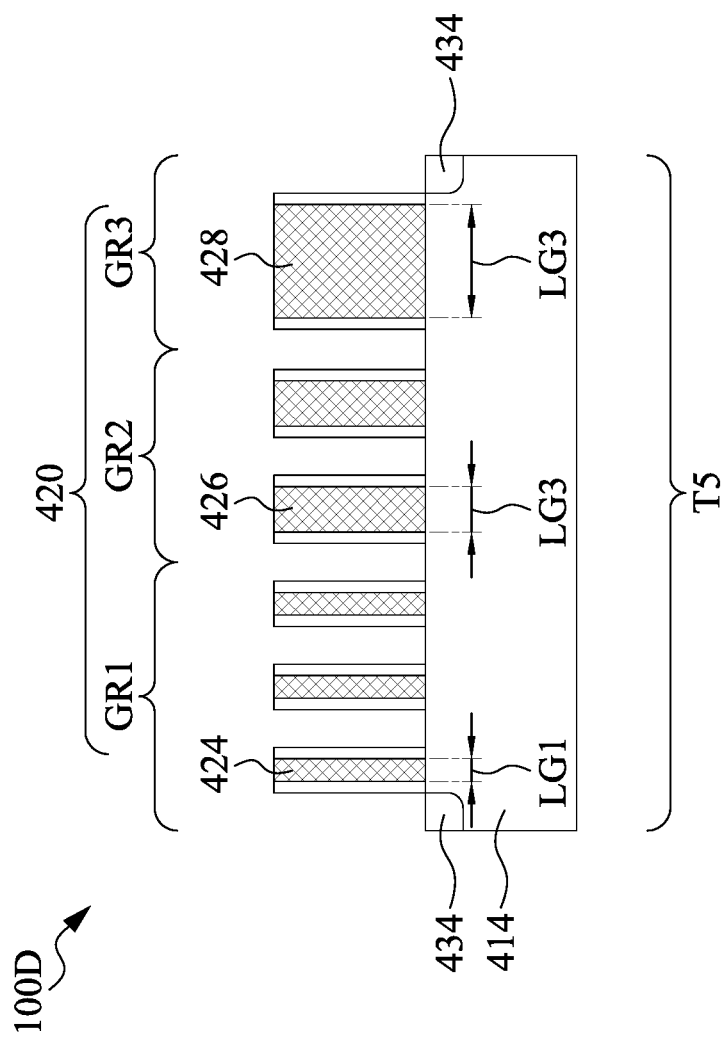
Figure 4C:
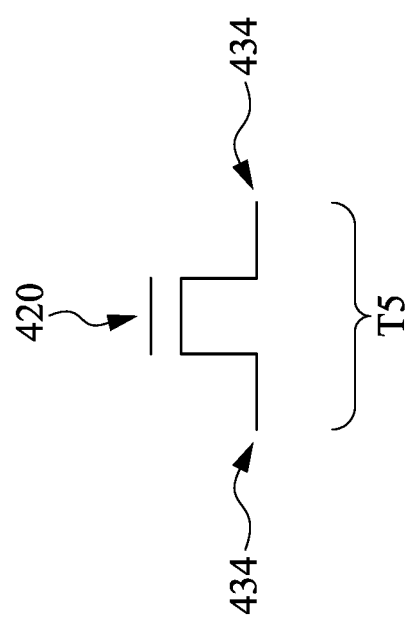
FIG. 4C illustrates an equivalent circuit of FIGS. 4A and 4B.

FIGS. 4A, 4B, and 4C illustrate an integrated circuit 100D in accordance with some embodiments of the present disclosure, in which FIG. 4A is a top view of the integrated circuit 100D, and FIG. 4B is a cross-sectional view along line B-B of FIG. 4A. FIG. 4C illustrates an equivalent circuit of the integrated circuit 100D as shown in FIGS. 4A and 4B. Some elements of FIGS. 4A, 4B, and 4C are similar to those described in FIGS. 1A, 1B, and 1C, and thus relevant details will not be repeated for brevity.

As shown in FIGS. 4A, 4B, and 4C. The integrated circuit 100D includes a transistor T5. Although not shown in FIGS.

4A to 4C, the integrated circuit 100D may include a transistor T1 as described in FIGS. 1A to 1C. It is worth noted that the gate length LG1 of the first transistor T1 is a critical dimension in a corresponding technology node.

The transistor T5 has an active region 414 extending along the X direction. The transistor T5 includes gate structures 424 having a gate length LG1, gate structures 426 having a gate length LG2 and gate structures 428 having a gate length LG3, in which the gate length LG1 is a critical dimension in a corresponding technology node. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 . . . ). On the other hand, each of the gate structures 328 has a gate length LG3 greater than the gate length LG1 of the gate structures 324. In some embodiments, the gate length LG2 is m times the gate length LG1, in which m is a positive integer. That is, LG3=m*LG1, in which m is a positive integer. In some embodiments, m is a positive integer and is greater than 1 (e.g., m=2, 3, 4 . . . ). For example, n may be 2, and m may be 3, while the present disclosure is not limited thereto.

The gate structures 424 form a first group GR1, the gate structures 426 form a second group GR2, and the gate structure 428 form a third group GR3. In some embodiments, each of the groups GR1, GR2, and GR3 includes at least one gate structure having substantially the same gate length, while the gate length of one group is different from the gate lengths of other groups. In some embodiments, the groups Gr1, GR2, and GR3 are sequentially arranged along the X direction. That is, a gate structure 426 and/or a gate structure 428 may not exist between two gate structures 424, and vice versa. In some embodiments, the gate structures 424, 426, and 428 are electrically connected and can be collectively referred to as a gate 420, in which the gate 420 serves as the gate of the transistor T5. In some embodiments, the gate structures 424, 426, and 428 are electrically connected to the same voltage node. From another view point, the gate 420 of the transistor T5 can be regarded as having several segments (e.g., gate structures 424, 426, and 428) arranged along the X direction, in which each segment has spacers 106 disposed on its opposite sidewalls. Also, the segments can be divided into several groups (e.g., groups GR1, GR2, and GR3), in which the segments in each group has substantially the same gate length.

The effective gate length of the gate 420 of the transistor T5 is 3*LG1+2*LG2+1*LG3. From another view point, because gate length LG2 of gate structures 426 can be expressed as n*LG1, and the gate length LG3 of gate structure 428 can be expressed as m*LG1. Accordingly, the effective gate length of the gate 420 of the transistor T5 can also be expressed as 3*LG1+2*n*LG1+1*m*LG1, namely (3+2*n+1*m)*LG1. In some embodiment where n=2 and m=4, the effective gate length of the gate 420 of the transistor T5 is 11 times (e.g., 3+2*2+1*4 times) the gate length LG1 having a critical dimension. As a result, the transistor T5 can be referred to as a long channel device. It is noted that the integrated circuit 100D of FIGS. 4A to 4C may also include a short channel device, such as the transistor T1 described in FIGS. 1A to 1C.

The transistor T5 has a plurality of source/drain regions 434 disposed in the active region 414. In greater detail, the source/drain regions 434 are disposed on opposite sides of the gate 420 of the transistor T5. That is, the source/drain regions 434 are disposed adjacent to the outmost gate structures. As an example in FIGS. 4A and 4B, one source/drain region 434 is disposed adjacent to the leftmost gate structure 424, and another one source/drain region 434 is disposed adjacent to the rightmost gate structure 428. It is noted that, in some embodiments, there is no source/drain region between any two adjacent gate structures 424, 426, and 428 of the transistor T5. In other words, portions of the active region 414 between any two adjacent gate structures 424, 426, and 428 are un-doped or less-doped, in which the dopant concentration of these portions is less than the dopant concentration of the source/drain regions 434. In practice, a first voltage and a second voltage may be applied respectively to the source/drain regions 434, and a third voltage may be applied to the gate 420 to operate the transistor T5. That is, a single voltage (e.g., the third voltage described herein) is applied to the gate structures 424, 426, and 428.

Figure 5A:
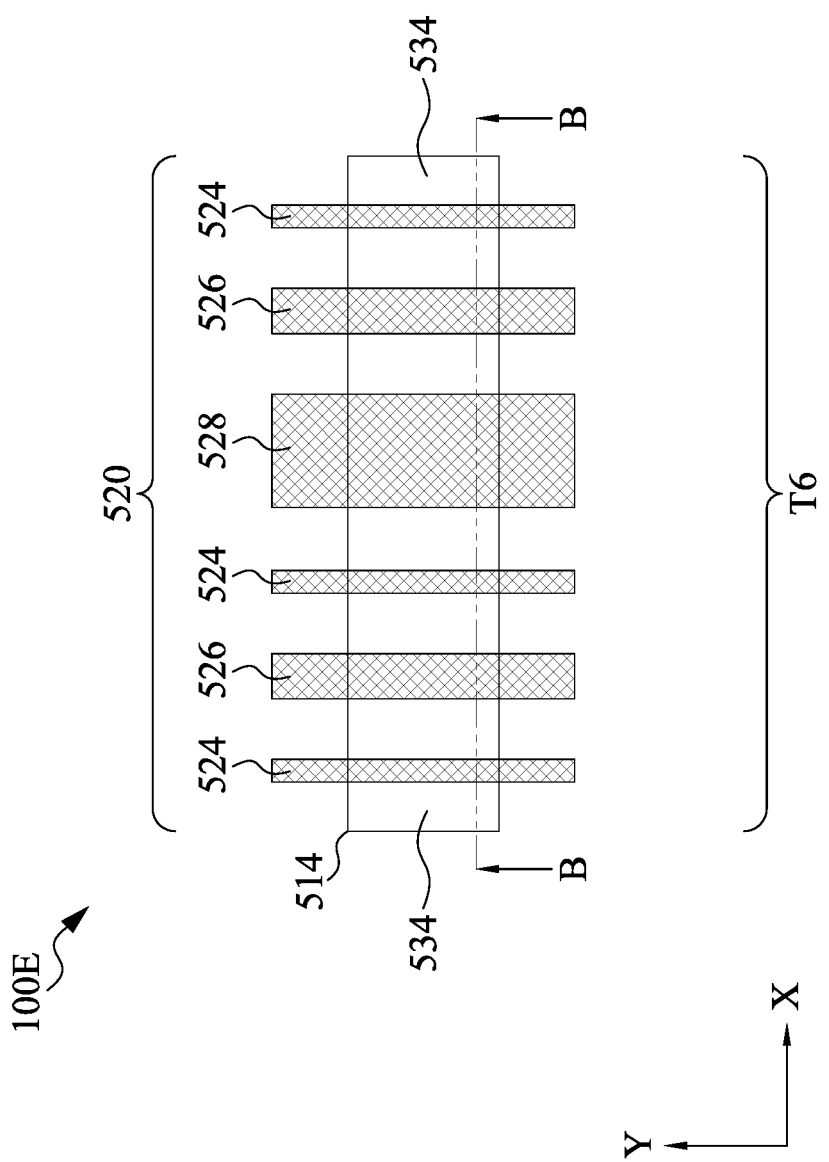
FIGS. 5A and 5B illustrate a top view and a cross-sectional view of an integrated circuit in accordance with some embodiments of the present disclosure.
Figure 5B:
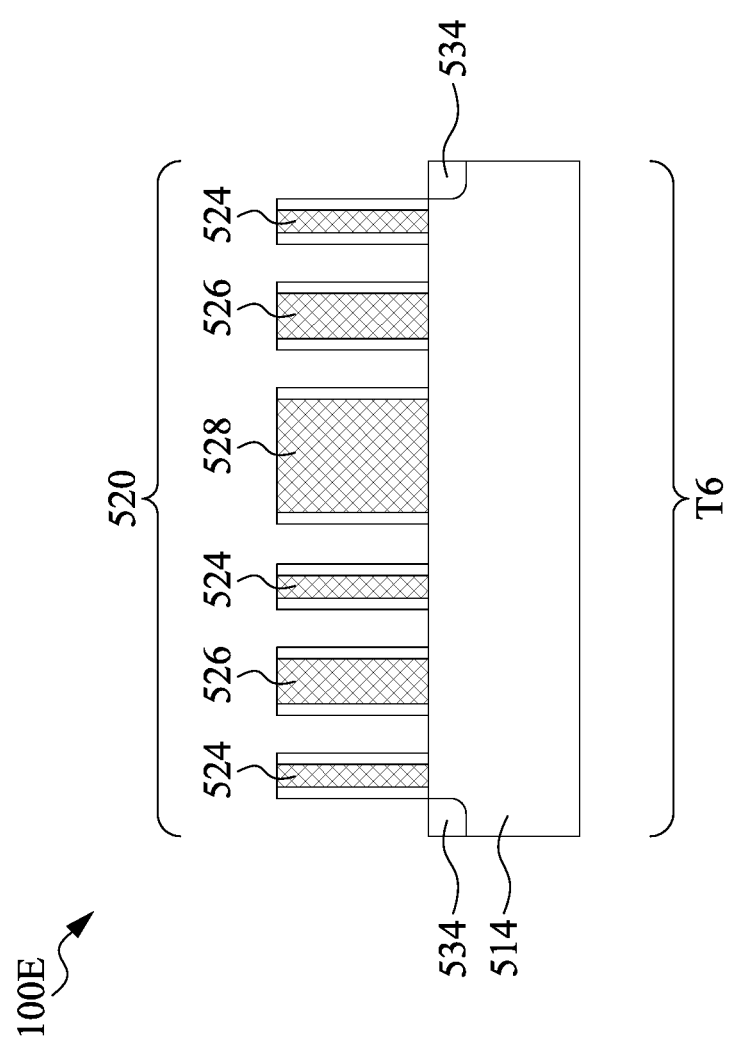
Figure 5C:
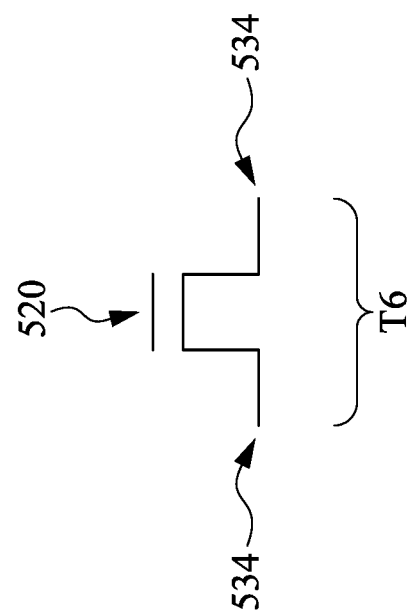
FIG. 5C illustrates an equivalent circuit of FIGS. 5A and 5B.

FIGS. 5A, 5B, and 5C illustrate an integrated circuit 100E in accordance with some embodiments of the present disclosure, in which FIG. 5A is a top view of the integrated circuit 100E, and FIG. 5B is a cross-sectional view along line B-B of FIG. 5A. FIG. 5C illustrates an equivalent circuit of the integrated circuit 100E as shown in FIGS. 5A and 5B. Some elements of FIGS. 5A, 5B, and 5C are similar to those described in FIGS. 1A, 1B, and 1C, and thus relevant details will not be repeated for brevity.

As shown in FIGS. 5A, 5B, and 5C. The integrated circuit 100E includes a transistor T6. Although not shown in FIGS. 5A to 5C, the integrated circuit 100E may include a transistor T1 as described in FIGS. 1A to 1C. It is worth noted that the gate length LG1 of the first transistor T1 is a critical dimension in a corresponding technology node.

The transistor T6 includes an active region 514 and a plurality of gate structures 524, 526, and 528 disposed on the active region 514. The gate structures 524 having a gate length LG1 are similar to the gate structures 424 of FIGS. 4A to 4C, the gate structures 526 having a gate length LG2 are similar to the gate structures 426 of FIGS. 4A to 4C, and the gate structure 528 having a gate length LG3 is similar to the gate structure 428 of FIGS. 4A to 4C, and thus relevant structural detail will not be repeated for brevity. The gate structures 526, 526, and 528 are electrically connected and can be collectively referred to as a gate 520, in which the gate 520 serves as the gate of the transistor T6. In some embodiments, the gate structures 524, 526, and 528 are electrically connected to the same voltage node.

The transistor T6 of FIGS. 5A to 5C is different from the transistor T5 of FIGS. 4A to 4C, at least in that the gate structures 524, 526, and 528 are randomly arranged along the X-direction. That is, for example, a gate structure 524 and/or a gate structure 528 may exist between two gate structures 524 having the same gate length LG1, and vice versa.

The transistor T6 has a plurality of source/drain regions 534 disposed in the active region 514. In greater detail, the source/drain regions 534 are disposed on opposite sides of the gate 520 of the transistor T5. That is, the source/drain regions 534 are disposed adjacent to the outmost gate structures. As an example in FIGS. 5A and 5B, one source/drain region 534 is disposed adjacent to the leftmost gate structure 524, and another one source/drain region 534 is disposed adjacent to the rightmost gate structure 524. It is noted that, in some embodiments, there is no source/drain region between any two adjacent gate structures 524, 526, and 528 of the transistor T5. In other words, portions of the active region 514 between any two adjacent gate structures 524, 526, and 528 are un-doped or less-doped, in which the dopant concentration of these portions is less than the dopant concentration of the source/drain regions 534. In practice, a first voltage and a second voltage may be applied respectively to the source/drain regions 534, and a third voltage may be applied to the gate 520 to operate the transistor T6. That is, a single voltage (e.g., the third voltage described herein) is applied to the gate structures 524, 526, and 528.

Figure 6A:
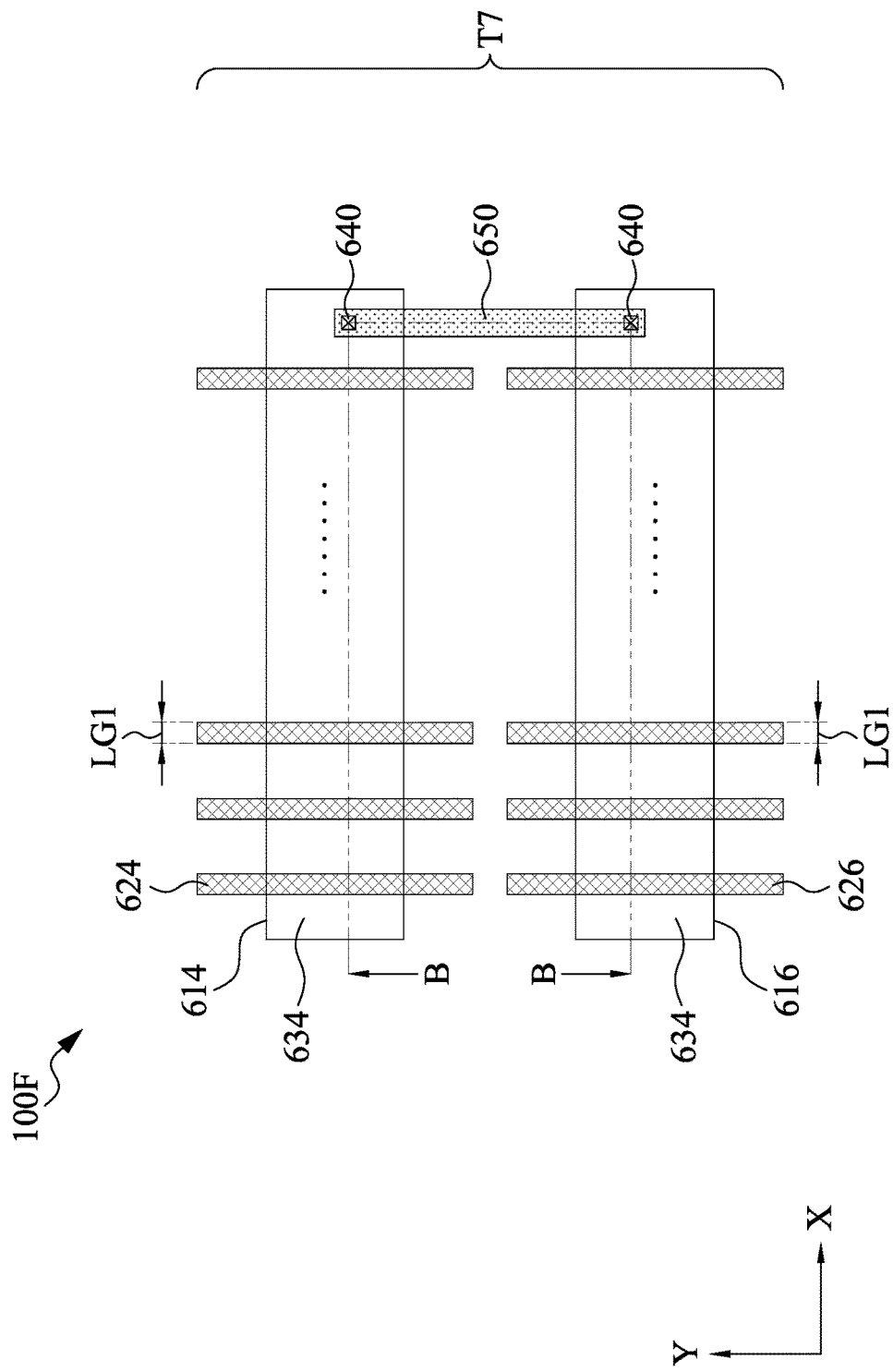
FIGS. 6A and 6B illustrate a top view and a cross-sectional view of an integrated circuit in accordance with some embodiments of the present disclosure.
Figure 6B:
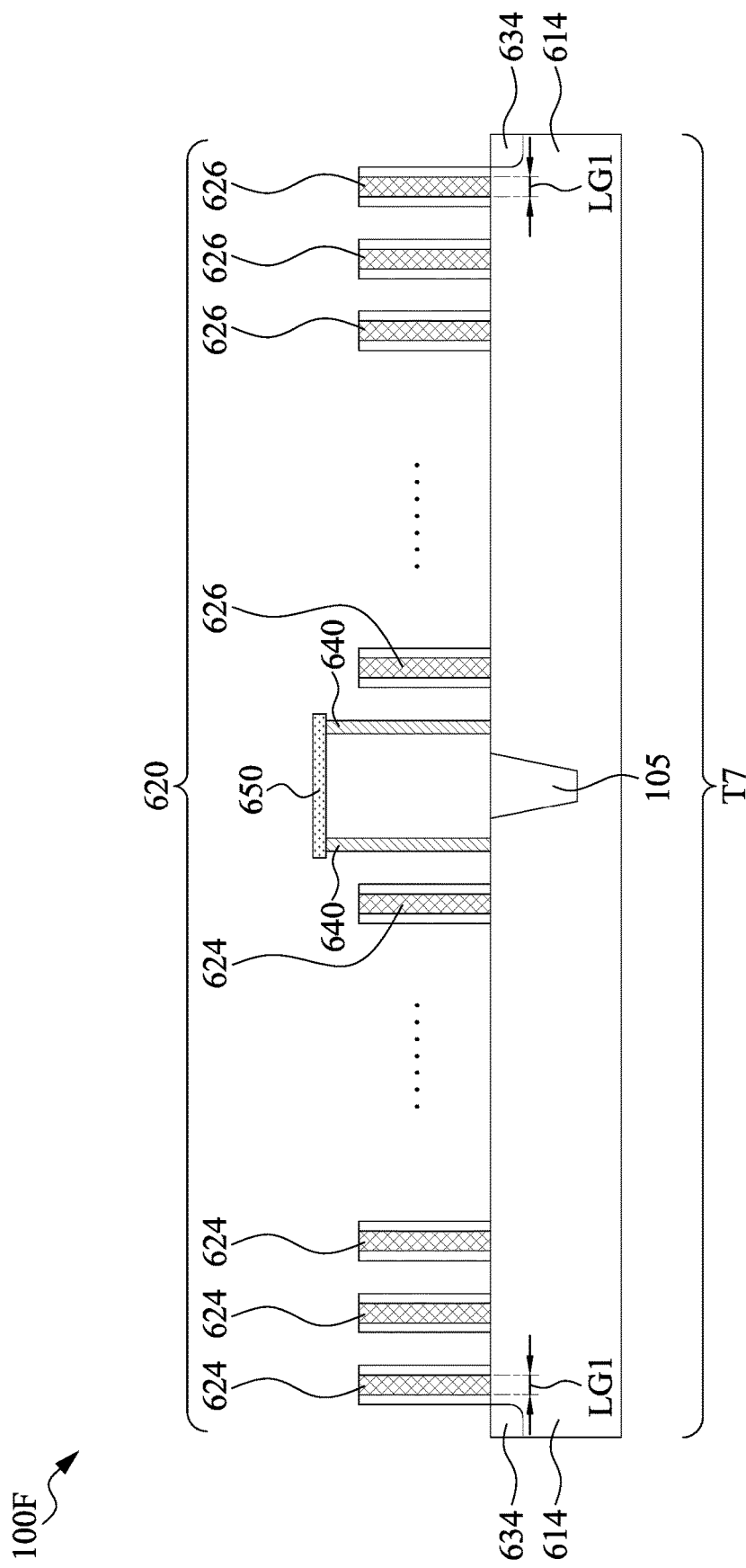
Figure 6C:
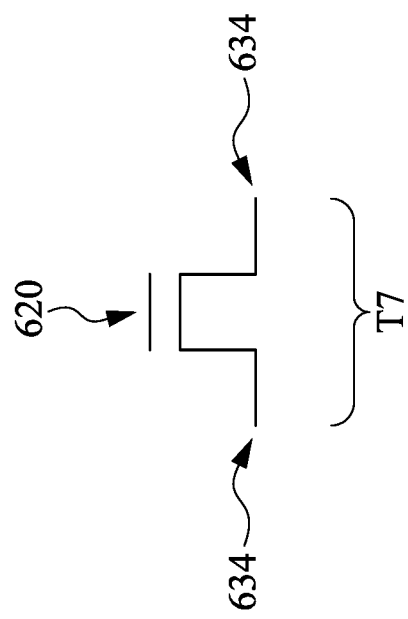
FIG. 6C illustrates an equivalent circuit of FIGS. 6A and 6B.

FIGS. 6A, 6B, and 6C illustrate an integrated circuit 100F in accordance with some embodiments of the present disclosure, in which FIG. 6A is a top view of the integrated circuit 100F, and FIG. 6B is a cross-sectional view along line B-B of FIG. 6A. FIG. 6C illustrates an equivalent circuit of the integrated circuit as shown in FIGS. 6A and 6B. Some elements of FIGS. 6A, 6B, and 6C are similar to those described in FIGS. 1A, 1B, and 1C, and thus relevant details will not be repeated for brevity.

The integrated circuit 100F includes a transistor T7. Although not shown in FIGS. 6A to 6C, the integrated circuit 100F may include a transistor T1 as described in FIGS. 1A to 1C. It is worth noted that the gate length LG1 of the first transistor T1 is a critical dimension in a corresponding technology node.

The transistor T7 has active regions 614 and 616 extending along the X direction, in which the active regions 614 and 616 are arranged along the Y direction. The transistor T7 has contacts 640 disposed respectively on the active regions 614 and 616, and a metal line 650 over the contacts and electrically connecting the contacts 640. Accordingly, the active region 614 is electrically connected to the active region 616 via the contacts 640 and the metal line 650. In some embodiments, the contacts 640 and metal line 650 are formed of suitable metals, such as copper, aluminum, tungsten, the like or combinations thereof.

The second transistor T7 includes a plurality of gate structures 624 disposed on the active regions 614 and 616. In some embodiments, each of the gate structures 624 has a gate length LG1. That is, each of the gate structures 224 of the second transistor T7 has substantially the same gate length, in which the gate length LG1 is a critical dimension in a corresponding technology node. In some embodiments, gate spacers 106 are disposed on opposite sidewalls of each of the gate structures 624.

In some embodiments, the gate structures 624 are electrically connected and can thus be collectively referred to as a gate 620 in the equivalent circuit of FIG. 6C, in which the gate 620 serves as the gate of the transistor T7. In some embodiments, the gate structures 624 are electrically connected to the same voltage node. Stated another way, the gate 620 of the transistor T7 can be regarded as having several segments (e.g., gate structures 624) arranged along the X direction, in which each segment has spacers 106 disposed on its opposite sidewalls. As mentioned above, each of the gate structures 624 has a gate length LG1. Accordingly, if the number of the gate structures 624 is n, the effective gate length of the gate 620 of the transistor T7 is n*LG1, in which n is a positive integer that is greater than 1. As a result, the transistor T7 can be referred to as a long channel device. It is noted that the integrated circuit 100F of FIGS. 6A to 6C may also include a short channel device, such as the transistor T1 described in FIGS. 1A to 1C.

The transistor T7 has a plurality of source/drain regions 634 disposed in the active regions 614 and 616, respectively. In greater detail, one source/drain region 634 is disposed on a first side of the active region 614, in which the contact 640 is disposed on a second side of the active region 614 opposite to the first side of the of active region 614. On the other hand, another one source/drain region 634 is disposed on a first side of the active region 616, in which the contact 640 is disposed on a second side of the active region 616 opposite to the first side of the of active region 616. That is, the source/drain regions 634 are disposed on two separated active regions 614 and 616. It is noted that, in some embodiments, there is no source/drain region between any two adjacent gate structures 624 of transistor T7. In other words, portions of the active regions 614 and 616 between any two adjacent gate structures 624 are un-doped or less-doped, in which the dopant concentration of these portions is less than the dopant concentration of the source/drain regions 634. In operation of the transistor T7, a first voltage and a second voltage may be applied respectively to the source/drain regions 634, and a third voltage may be applied to the gate 620 to operate the transistor T7. That is, a single voltage (e.g., the third voltage described herein) is applied to the gate structures 624. For example, the current may flow from the source/drain region 634 on the active region 614 to the source/drain region 634 on the active region 616 through the contacts 640 and the metal line 650.

Figure 7A:
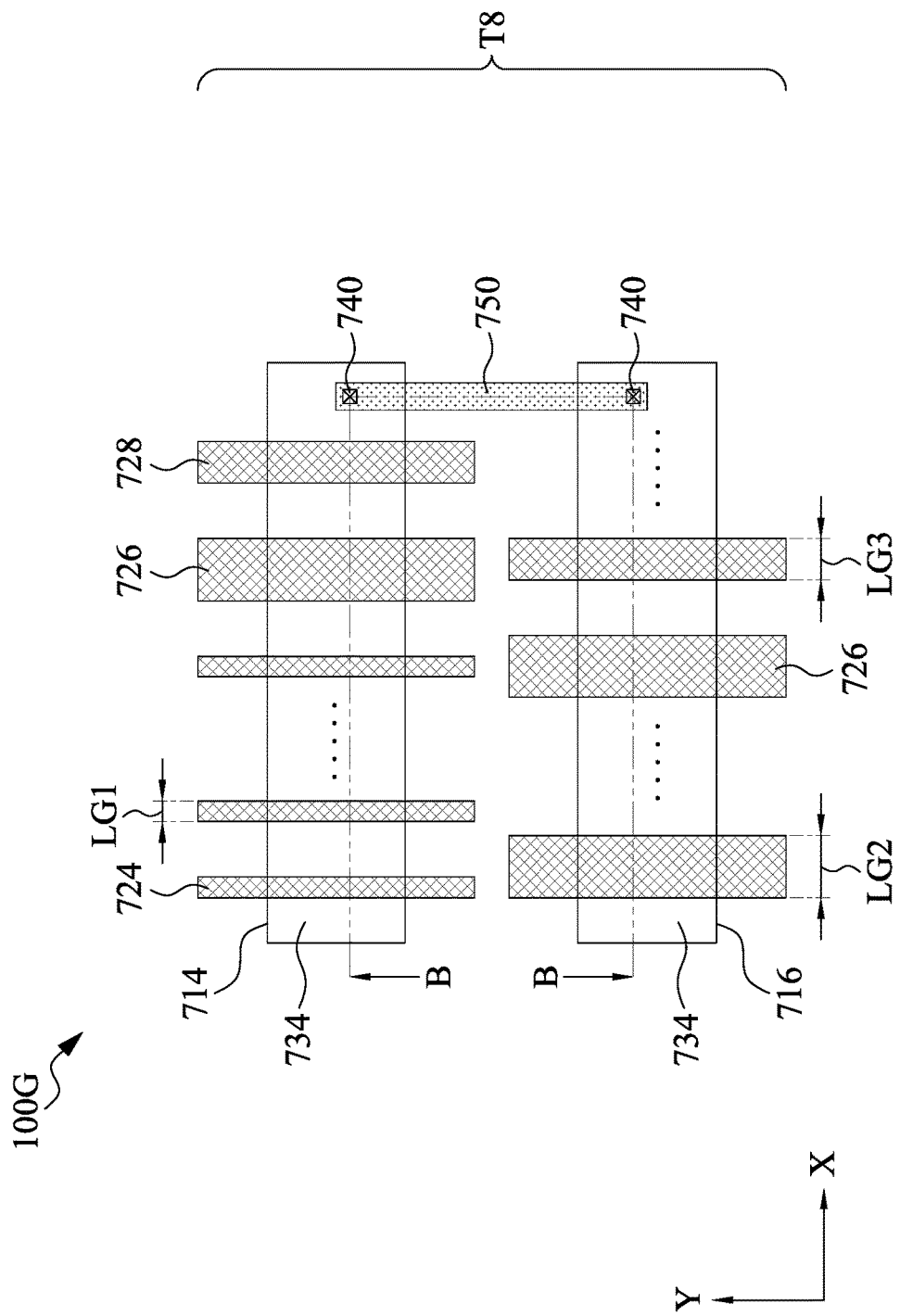
FIGS. 7A and 7B illustrate a top view and a cross-sectional view of an integrated circuit in accordance with some embodiments of the present disclosure.
Figure 7B:
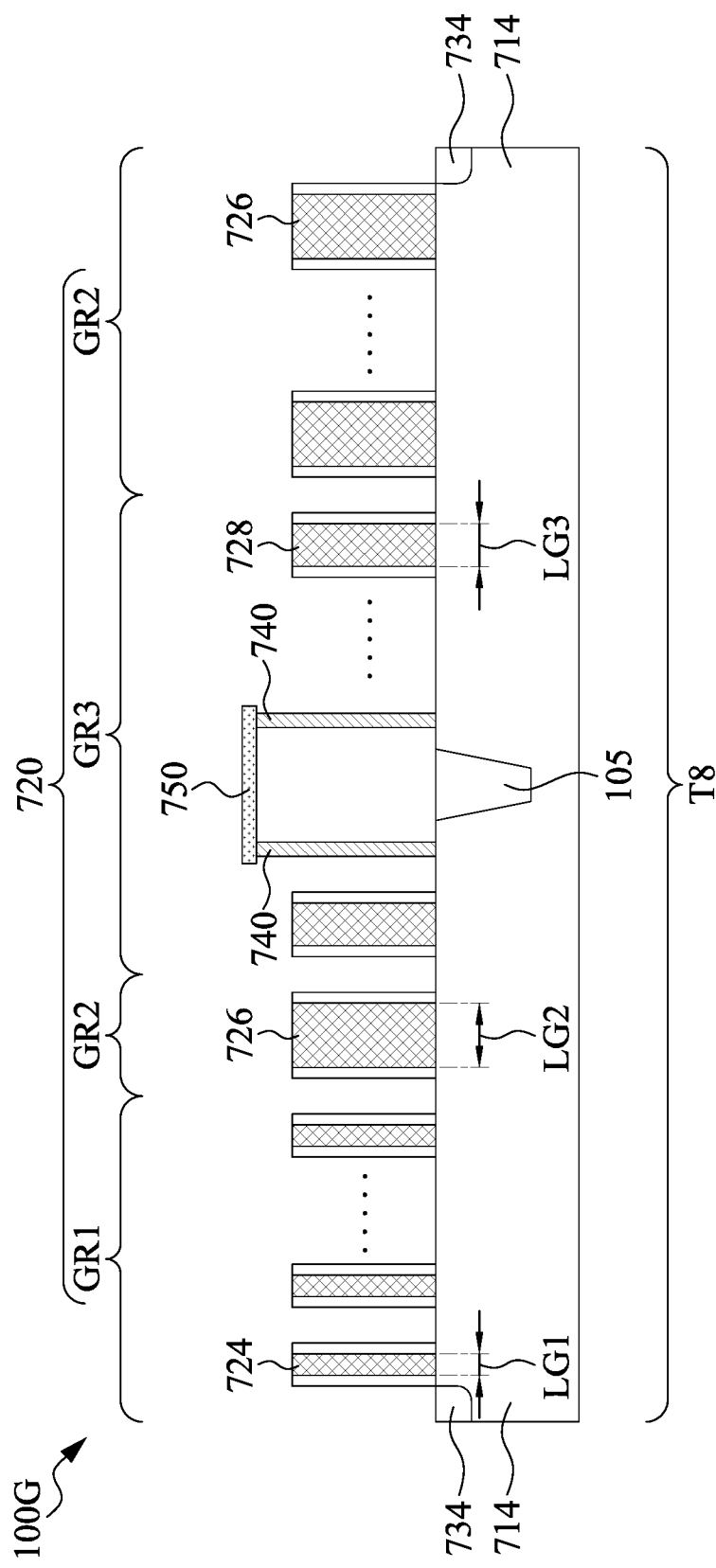
Figure 7C:
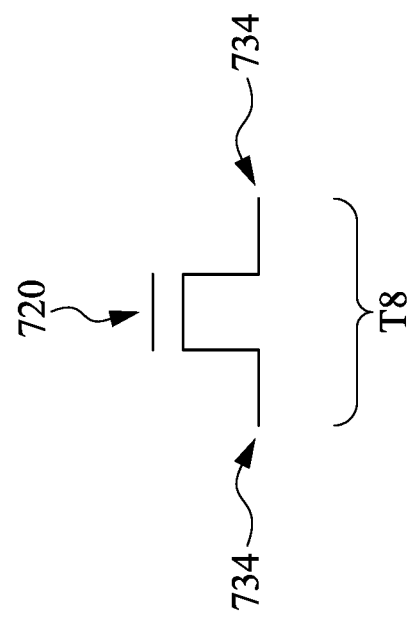
FIG. 7C illustrates an equivalent circuit of FIGS. 7A and 7B.

FIGS. 7A, 7B, and 7C illustrate an integrated circuit 100G in accordance with some embodiments of the present disclosure, in which FIG. 7A is a top view of the integrated circuit 100G, and FIG. 7B is a cross-sectional view along line B-B of FIG. 7A. FIG. 7C illustrates an equivalent circuit of the integrated circuit 100G as shown in FIGS. 7A and 7B. Some elements of FIGS. 7A, 7B, and 7C are similar to those described in FIGS. 1A, 1B, and 1C, and thus relevant details will not be repeated for brevity.

The integrated circuit 100G includes a transistor T8. Although not shown in FIGS. 7A to 7C, the integrated circuit 100G may include a transistor T1 as described in FIGS. 1A to 1C. It is worth noted that the gate length LG1 of the first transistor T1 is a critical dimension in a corresponding technology node.

Similar to the transistor T7 of FIGS. 6A to 6C, the transistor T8 has separate active regions 714 and 716. The transistor T8 has contacts 740 disposed respectively on the active regions 714 and 716, and a metal line 750 over the contacts 740 and electrically connects the contacts 740.

The transistor T8 includes a plurality of gate structures 724, a plurality of gate structures 726, and a plurality of gate structures 728 disposed on the active regions 714 and 716, respectively. The gate structures 724, 726 and 728 are electrically connected. In some embodiments, the gate structures 724, 726, and 728 are electrically connected to the same voltage node. In some embodiments, the number of the gate structures 724 may be x, the number of the gate structures 726 may be y, and the number of the gate structures 728 may be z, in which x, y, z are positive integers. In some embodiments, each of the gate structures 724 has a gate length LG1, in which the gate length LG1 is a critical dimension in a corresponding technology node. Each of the gate structures 726 has a gate length LG2 greater than the gate length LG1 of the gate structures 724. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 . . . ). On the other hand, each of the gate structures 728 has a gate length LG3 greater than the gate length LG1 of the gate structures 724. In some embodiments, the gate length LG2 is m times the gate length LG1, in which m is a positive integer. That is, LG3=m*LG1, in which m is a positive integer. In some embodiments, m is a positive integer and is greater than 1 (e.g., m=2, 3, 4 . . . ). In the embodiments of FIGS. 7A to 7C, n is greater than m. For example, n may be 3, and m may be 2, while the present disclosure is not limited thereto.

The gate structures 724 form a first group GR1, the gate structures 726 form a second group GR2, and the gate structures 728 form a third group GR3. In some embodiments, each of the groups GR1, GR2, and GR3 includes at least one gate structure having substantially the same gate length, while the gate length of one group is different from the gate lengths of other groups. In some embodiments, the groups GR1, GR2, and GR3 are sequentially arranged along the X direction. In some embodiments, the gate structures 724, 726, and 726 are electrically connected and can be collectively referred to as a gate 720, in which the gate 720 serves as the gate of the transistor T8. In some embodiments, the gate structures 724, 726, and 728 are electrically connected to the same voltage node. From another view point, the gate 720 of the transistor T8 can be regarded as having several segments (e.g., gate structures 724, 726, and 728) arranged along the X direction, in which each segment has spacers 106 disposed on its opposite sidewalls. Also, the segments can be divided into several groups (e.g., groups GR1, GR2, and GR3), in which the segments in each group has substantially the same gate length.

As mentioned above, the numbers of gate structures 724, 726, and 728 are x, y, and z, respectively, in which x, y, z are positive integers. Accordingly, the effective gate length of the gate 720 of the transistor T8 is x*LG1+y*LG2+z*LG3. From another view point, because gate length LG2 of gate structures 726 can be expressed as n*LG1, and the gate length LG3 of gate structures 728 can be expressed as m*LG1. Accordingly, the effective gate length of the gate 720 of the transistor T8 can also be expressed as x*LG1+ y*n*LG1+z*m*LG1, namely (x+y*n+z*m)*LG1. Because x, y, z, n, m are all positive integer, the term x+y*n+z*m is also a positive integer. That is, the effective gate length of the gate 720 of the transistor T8 is multiple times (e.g., x+y*n+ z*m times) the gate length LG1 having a critical dimension. As a result, the transistor T8 can be referred to as a long channel device. It is noted that the integrated circuit 100G of FIGS. 7A to 7C may also include a short channel device, such as the transistor T1 described in FIGS. 1A to 1C.

In some embodiments, the gate structures 724, 726, and 728 are randomly arranged along the X-direction. That is, for example, a gate structure 724 and/or a gate structure 728 may exist between two gate structures 724 having the same gate length LG1, and vice versa. In some other embodiments, a gate structure 726 and/or a gate structure 728 may not exist between two gate structures 724, and vice versa.

The transistor T8 has a plurality of source/drain regions 734 disposed in the active regions 714 and 716, respectively. In greater detail, one source/drain region 734 is disposed on a first side of the active region 714, in which the contact 740 is disposed on a second side of the active region 714 opposite to the first side of the of active region 714. On the other hand, another one source/drain region 734 is disposed on a first side of the active region 716, in which the contact 740 is disposed on a second side of the active region 716 opposite to the first side of the of active region 716. That is, the source/drain regions 734 are disposed on two separated active regions 714 and 716. It is noted that, in some embodiments, there is no source/drain region between any two adjacent gate structures 724, 726, and 728 of transistor T8. In other words, portions of the active regions 714 and 716 between any two adjacent gate structures 724, 726, and 728 are un-doped or less-doped, in which the dopant concentration of these portions is less than the dopant concentration of the source/drain regions 734. In operation of the transistor T7, a first voltage and a second voltage may be applied respectively to the source/drain regions 734, and a third voltage may be applied to the gate 720 to operate the transistor T8. That is, a single voltage (e.g., the third voltage described herein) is applied to the gate structures 724, 726 and 728. For example, the current may flow from the source/drain region 734 on the active region 714 to the source/drain region 734 on the active region 716 through the contacts 740 and the metal line 750.

Figure 8A:
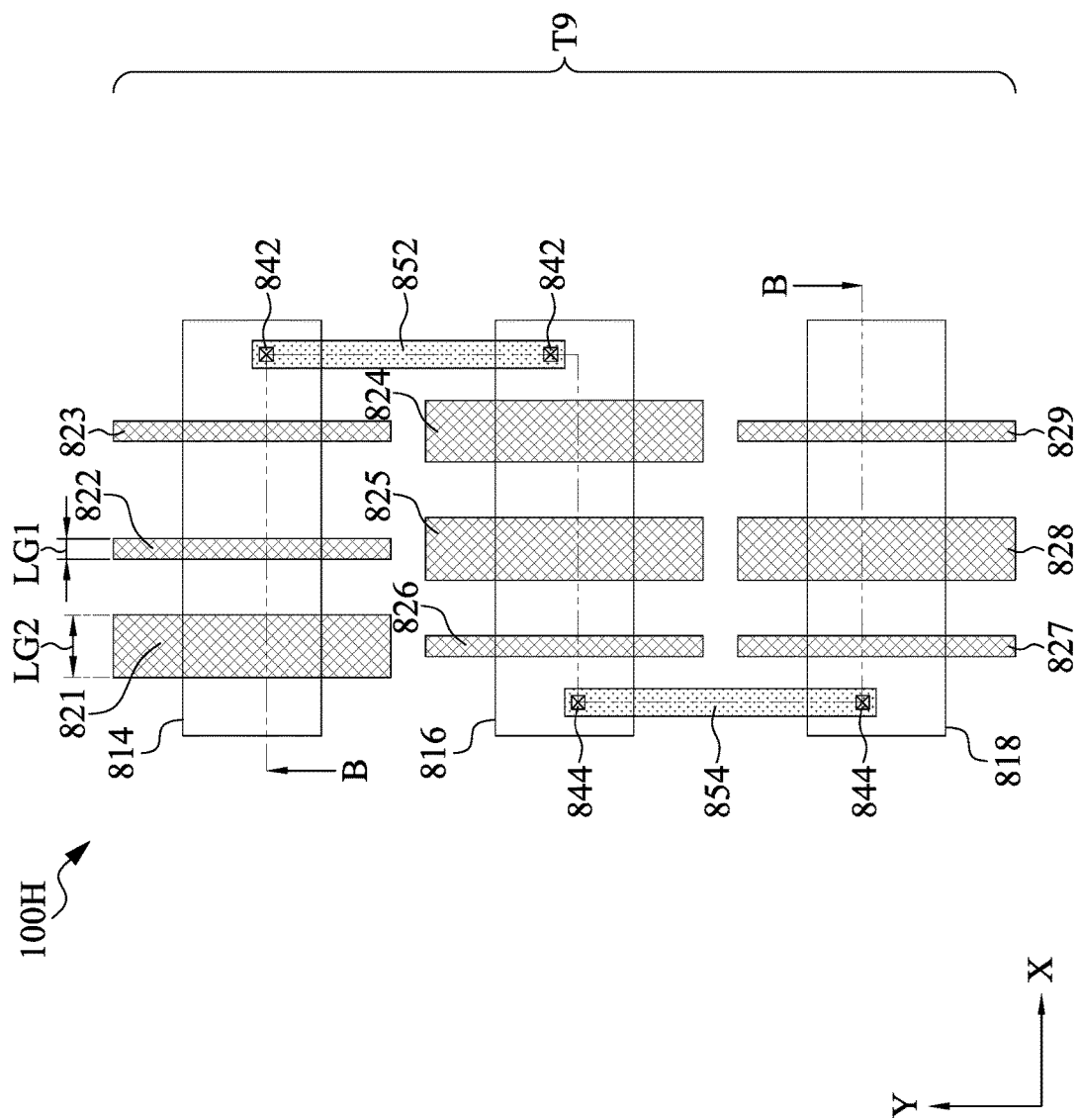
FIGS. 8A and 8B illustrate a top view and a cross-sectional view of an integrated circuit in accordance with some embodiments of the present disclosure.
Figure 8B:
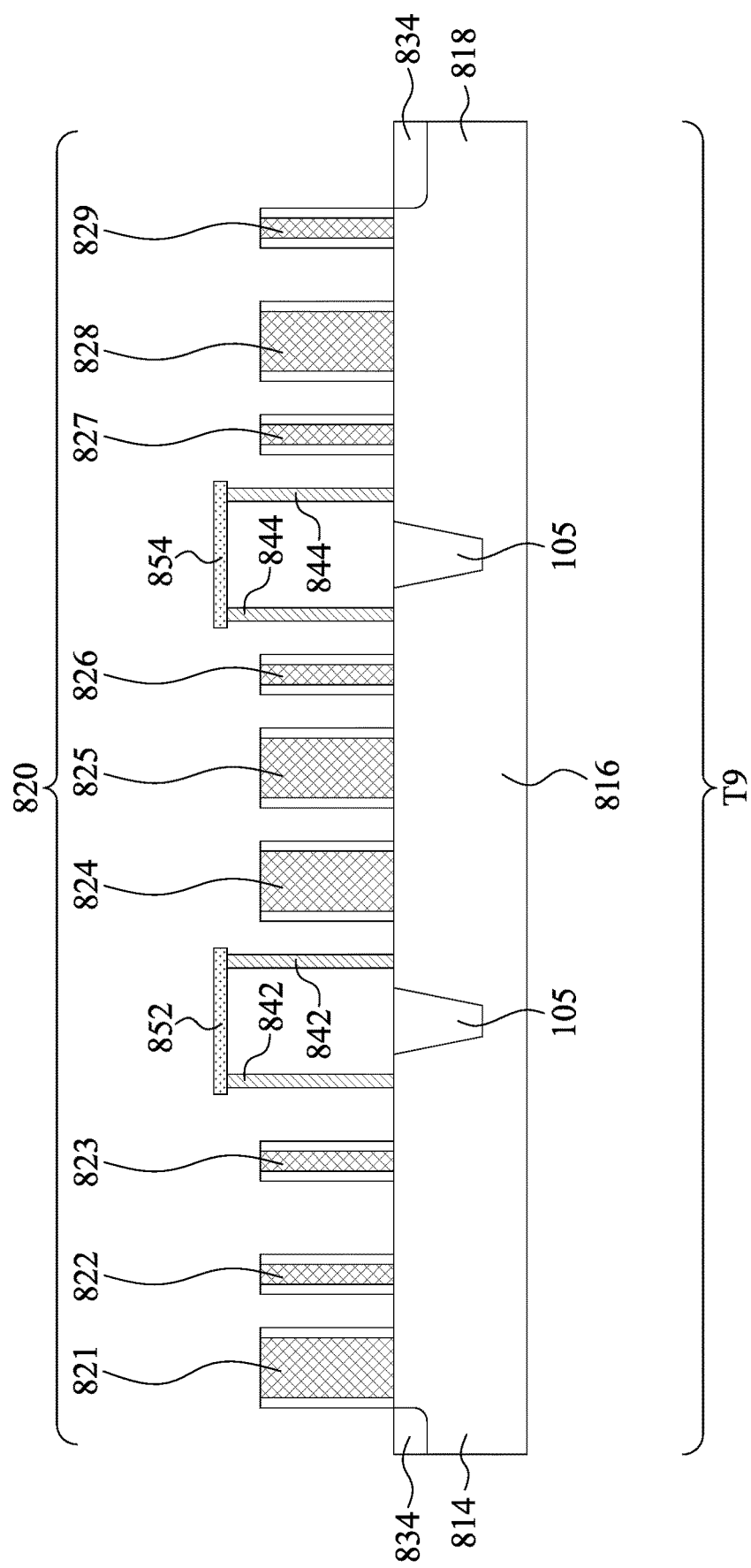
Figure 8C:
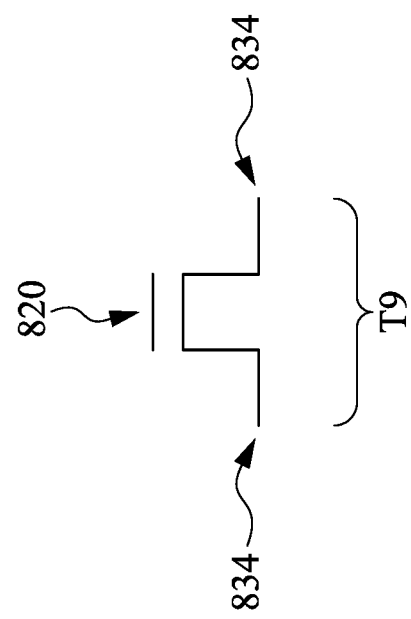
FIG. 8C illustrates an equivalent circuit of FIGS. 8A and 8B.

FIGS. 8A, 8B, and 8C illustrate an integrated circuit 100H in accordance with some embodiments of the present disclosure, in which FIG. 8A is a top view of the integrated circuit 100H, and FIG. 8B is a cross-sectional view along line B-B of FIG. 8A. FIG. 8C illustrates an equivalent circuit of the integrated circuit 100H as shown in FIGS. 8A and 8B. Some elements of FIGS. 8A, 8B, and 8C are similar to those described in FIGS. 1A, 1B, and 1C, and thus relevant details will not be repeated for brevity.

The integrated circuit 100H includes a transistor T9. Although not shown in FIGS. 8A to 8C, the integrated circuit 100H may include a transistor T1 as described in FIGS. 1A to 1C. It is worth noted that the gate length LG1 of the first transistor T1 is a critical dimension in a corresponding technology node.

The transistor T9 has active regions 814, 816, and 818 extending along the X direction, in which the active regions 814, 816, and 818 are arranged along the Y direction. The transistor T9 has contacts 842 disposed respectively on the active regions 814 and 816, and a metal line 852 over the contacts 842 and electrically connecting the contacts 842. Accordingly, the active region 814 is electrically connected to the active region 816 via the contacts 842 and the metal line 852. On the other hand, the transistor T9 further has contacts 844 disposed respectively on the active regions 816 and 818, and a metal line 854 over and electrically connecting the contacts 844. Accordingly, the active region 816 is electrically connected to the active region 818 via the contacts 844 and the metal line 854.

The transistor T9 includes gate structures 821, 822, 823, 824, 825, 826, 827, 828, and 829 electrically connected by using, e.g., one or more metal lines and vias in the BEOL interconnect structure. In some embodiments, the gate structures 821-829 are electrically connected to the same voltage node. The gate structures 821, 822, and 823 are disposed on the active region 814, the gate structures 824, 825, and 826 are disposed on the active region 816, and the gate structures 827, 828, and 829 are disposed on the active region 818.

In some embodiments, each of the gate structures 821 to 829 may include either a short gate length or a long gate length. As an example of FIGS. 8A and 8B, the gate structures 821, 824, 825, and 828 have long gate length, while the gate structures 822, 823, 826, 827, and 829 have short gate length. In some embodiments, the gate structures 822, 823, 826, 827, and 829 have substantially the same gate length LG1, in which the gate length LG1 is a critical dimension in a corresponding technology node. On the other hand, the gate structures 821, 824, 825, and 828 have substantially the same gate length LG2. The gate length LG2 is greater than the gate length LG1. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 . . . ).

In some embodiments, the gate structures 821 to 829 are electrically connected and can be collectively referred to as a gate 820, in which the gate 820 serves as the gate of the transistor T9. In some embodiments, the gate structures 821-829 are electrically connected to the same voltage node. Stated another way, the gate 820 of the transistor T9 can be regarded as having several segments (e.g., gate structures 821 to 829) arranged along the X direction, in which each segment has spacers 106 disposed on its opposite sidewalls.

In some embodiments, the transistor T9 may include x gate structures having short gate length LG1 and y gate structures having long gate length LG2 (e.g., x=5 and y=4 in this case). Accordingly, the effective gate length of the gate 820 of the transistor T9 is x*LG1+y*LG2. From another view point, because gate length LG2 can be expressed as n*LG1, the effective gate length of the gate 820 of the transistor T9 can also be expressed as x*LG1+y*n*LG1, namely (x+y*n)*LG1. Because x, y, n are all positive integer, the term x+y*n is also a positive integer. That is, the effective gate length of the gate 820 of the transistor T9 is multiple times (e.g., x+y*n times) the gate length LG1 having a critical dimension. As a result, the transistor T9 can be referred to as a long channel device. It is noted that the integrated circuit 100H of FIGS. 8A to 8C may also include a short channel device, such as the transistor T1 described in FIGS. 1A to 1C.

The transistor T9 has a plurality of source/drain regions 834 disposed in the active regions 814 and 818, respectively. In greater detail, one source/drain region 734 is disposed on a first side of the active region 814, in which the contact 842 is disposed on a second side of the active region 814 opposite to the first side of the of active region 814. On the other hand, another one source/drain region 734 is disposed on a first side of the active region 818, in which the contact 844 is disposed on a second side of the active region 818 opposite to the first side of the of active region 818. That is, the source/drain regions 834 are disposed on two separated active regions 814 and 818. Further, the active region 816 between the active regions 814 and 818 does not include the source/drain regions 834. Stated another way, the entire active region 816 has dopant concentration lower than the dopant concentration of the source/drain regions 834. It is noted that, in some embodiments, there is no source/drain region between any two adjacent gate structures 821 to 829 of transistor T9. In other words, portions of the active regions 814, 816, and 818 between any two adjacent gate structures 821 to 829 are un-doped or less-doped, in which the dopant concentration of these portions is less than the dopant concentration of the source/drain regions 834. In operation of the transistor T8, a first voltage and a second voltage may be applied respectively to the source/drain regions 834, and a third voltage may be applied to the gate 820 to operate the transistor T9. That is, a single voltage (e.g., the third voltage described herein) is applied to the gate structures 821 to 829. For example, the current may flow from the source/drain region 834 on the active region 814 to the source/drain region 834 on the active region 818 through the active region 816. Further, the active region 814 is electrically connected to the active region 816 via the contacts 842 and the metal line 852, and the active region 816 is electrically connected to the active region 818 via the contacts 844 and the metal line 854.

FIG. 8D is a block diagram of the integrated circuit 100H of FIGS. 8A and 8C. As shown in FIG. 8D, shown there are blocks 821A, 822A, 823A, 824A, 825A, 826A, 827A, 828A, and 829A, in which each of the blocks 821A to 829A corresponds to a gate structure. For example, the blocks 821A to 829A may correspond to the gate structures 821 to 829 of FIG. 8A, respectively. In some embodiments, each of the blocks 821A to 829A may include either a short gate length or a long gate length. For example, the short gate length may be the gate length LG1 described in FIGS. 8A and 8B, and the long gate length may be the gate length LG2 described in FIGS. 8A and 8B. Accordingly, each of the blocks 821A to 829A may include two possibilities of gate lengths (e.g., short gate length or long gate length). In the regard, the combinations of blocks 821A to 829A of the integrated circuit 100H may include $2^9$ variations.

Figure 9A:
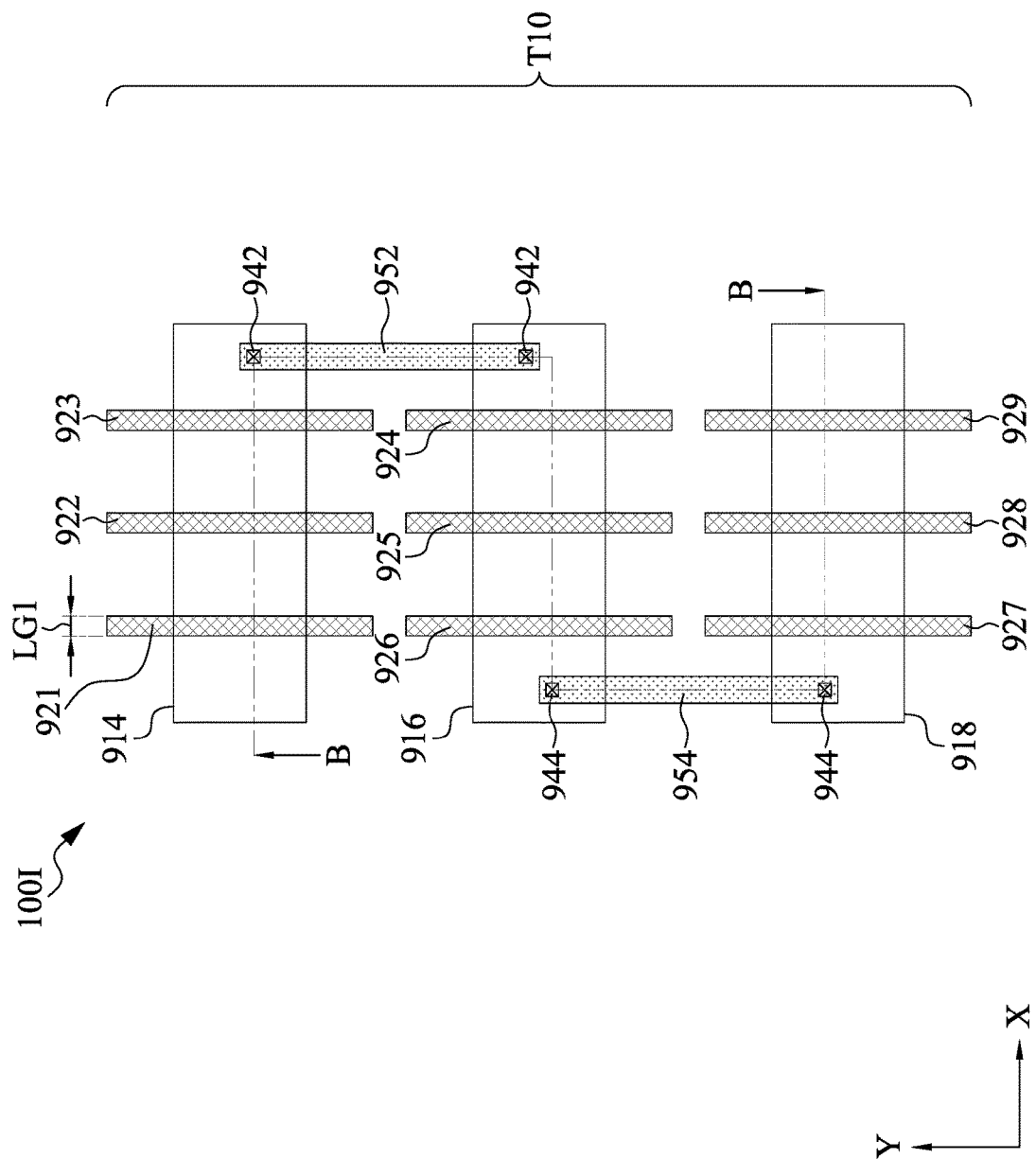
FIGS. 9A and 9B illustrate a top view and a cross-sectional view of an integrated circuit in accordance with some embodiments of the present disclosure.
Figure 9B:
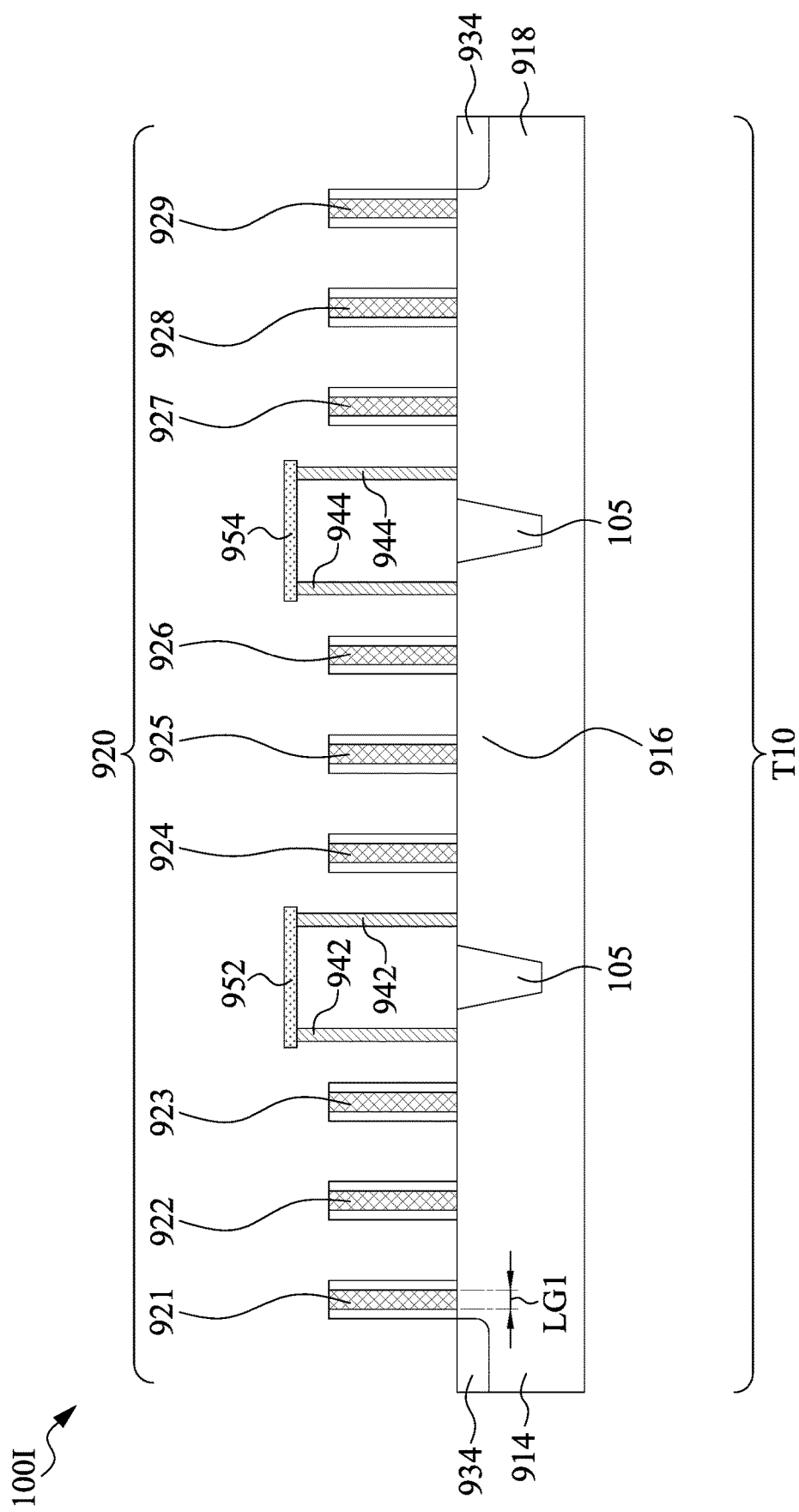
Figure 9C:
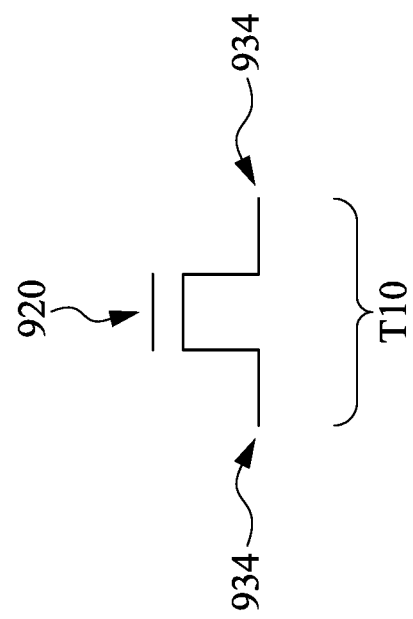
FIG. 9C illustrates an equivalent circuit of FIGS. 9A and 9B.

FIGS. 9A, 9B, and 9C illustrate an integrated circuit 100I in accordance with some embodiments of the present disclosure, in which FIG. 9A is a top view of the integrated circuit 100I, and FIG. 9B is a cross-sectional view along line B-B of FIG. 9A. FIG. 9C illustrates an equivalent circuit of the integrated circuit 100I FIGS. 9A and 9B. Some elements of FIGS. 9A, 9B, and 9C are similar to those described in FIGS. 1A, 1B, and 1C, and thus relevant details will not be repeated for brevity.

The integrated circuit 100I includes a transistor T10. Although not shown in FIGS. 9A to 9C, the integrated circuit 100I may include a transistor T1 as described in FIGS. 1A to 1C. It is worth noted that the gate length LG1 of the first transistor T1 is a critical dimension in a corresponding technology node.

Similar to the transistor T9 of FIGS. 8A to 8C, the transistor T10 has separate active regions 914, 916, and 918. The active region 914 is electrically connected to the active region 916 via the contacts 942 and the metal line 952. On the other hand, the active region 916 is electrically connected to the active region 918 via the contacts 944 and the metal line 954.

The transistor T10 includes gate structures 921, 922, 923, 924, 925, 926, 927, 928, and 929. The gate structures 921, 922, and 923 are disposed on the active region 914, the gate structures 924, 925, and 926 are disposed on the active region 916, and the gate structures 927, 928, and 929 are disposed on the active region 918, respectively.

In some embodiments, the gate structures 921 to 929 have substantially the same gate length LG1, in which the gate length LG1 is a critical dimension in a corresponding technology node.

In some embodiments, the gate structures 921 to 929 are electrically connected and can be collectively referred to as a gate 920, in which the gate 920 serves as the gate of the transistor T10. In some embodiments, the gate structures 921-929 are electrically connected to the same voltage node). Stated another way, the gate 920 of the transistor T10 can be regarded as having several segments (e.g., gate structures 921 to 929) arranged along the X direction, in which each segment has spacers 106 disposed on its opposite sidewalls.

In some embodiments, the transistor T10 may include x gate structures having gate length LG1 (e.g., x=9 in this case). Accordingly, the effective gate length of the gate 920 of the transistor T10 is x*LG1. As a result, the transistor T10 can be referred to as a long channel device. It is noted that the integrated circuit 100I of FIGS. 9A to 9C may also include a short channel device, such as the transistor T1 described in FIGS. 1A to 1C.

In some embodiments, the gate structures 921 to 929 may include different threshold voltages. Threshold voltage of each gate structures 921 to 929 may depend on the material composition and/or thickness of the gate dielectric and the work function metal layer(s) therein. As a result, the equivalent threshold voltage of the gate 920 depends on the threshold voltages of the gate structures 921 to 929.

The transistor T9 has a plurality of source/drain regions 934 disposed in the active regions 914 and 918, respectively. The relationship between the source/drain regions 934, the active regions 914, 916, 918, the gate structures 921 to 929, the contacts 942, 944, and the metal lines 952, 954 is similar to the relationship between the source/drain regions 834, the active regions 814, 816, 818, the gate structures 821 to 829, the contacts 842, 844, and the metal lines 852, 854, and thus relevant structural details will not be repeated for brevity.

FIG. 9D is a block diagram of the integrated circuit 100I of FIGS. 9A and 9C. As shown in FIG. 9D, shown there are blocks 921A, 922A, 923A, 924A, 925A, 926A, 927A, 928A, and 929A, in which each of the blocks 921A to 929A corresponds to a gate structure. For example, the blocks 921A to 929A may correspond to the gate structures 921 to 929 of FIG. 9A, respectively. As described above, each of the blocks 921A to 929A may denote to gate structures having different threshold voltages. As an example, for N7 technology node, there are three categories of threshold voltages, such as ultra-low threshold voltage (ULVT), low threshold voltage (LVT), and standard threshold voltage (SVT). In this regard, each of the blocks 921A to 929A may include three possibilities of threshold voltages. Accordingly, the combinations of blocks 921A to 929A of the integrated circuit 100I may include $3^9$ variations. On the other hand, with respect to the N5 technology node, there may be five categories of threshold voltages. As a result, the combinations of blocks 921A to 929A of the integrated circuit 100I may include $5^9$ variations.

Figure 10A:
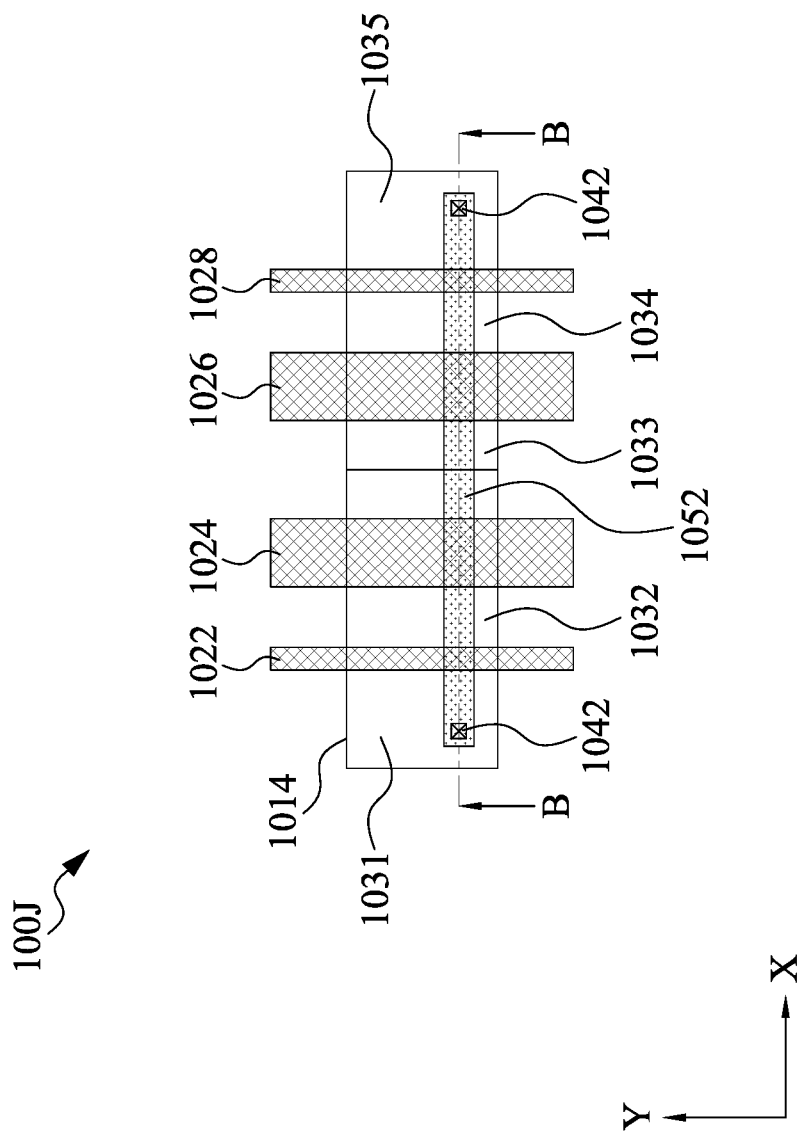
FIGS. 10A and 10B illustrate a top view and a cross-sectional view of an integrated circuit in accordance with some embodiments of the present disclosure.
Figure 10B:
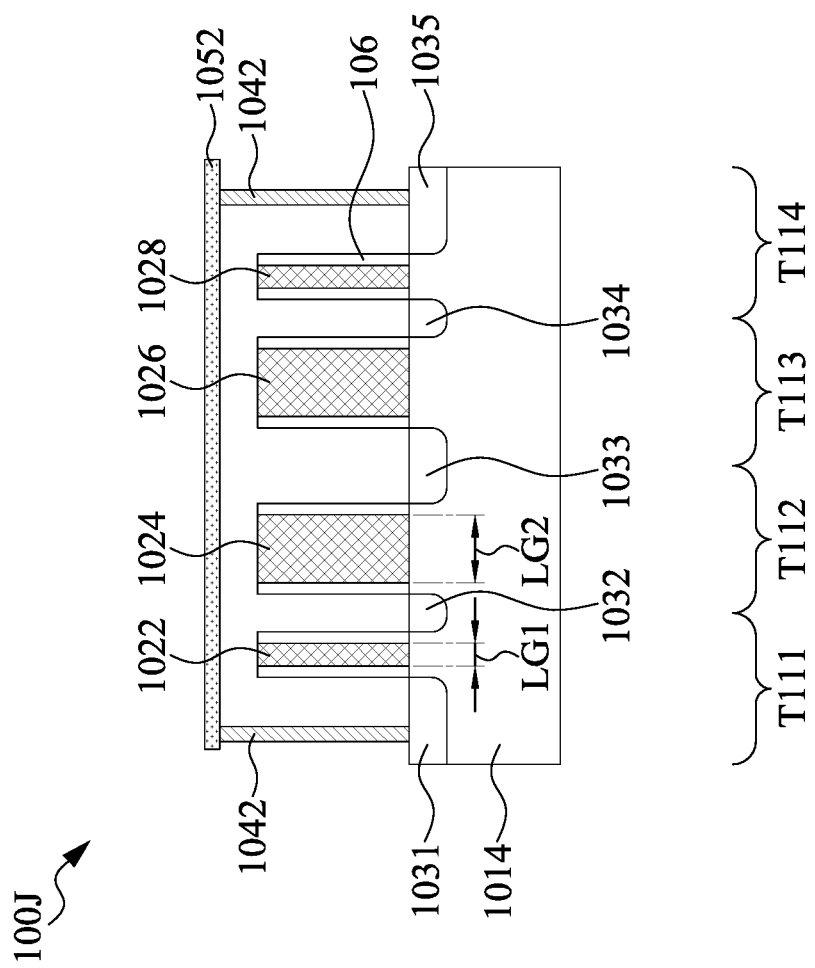
Figure 10C:
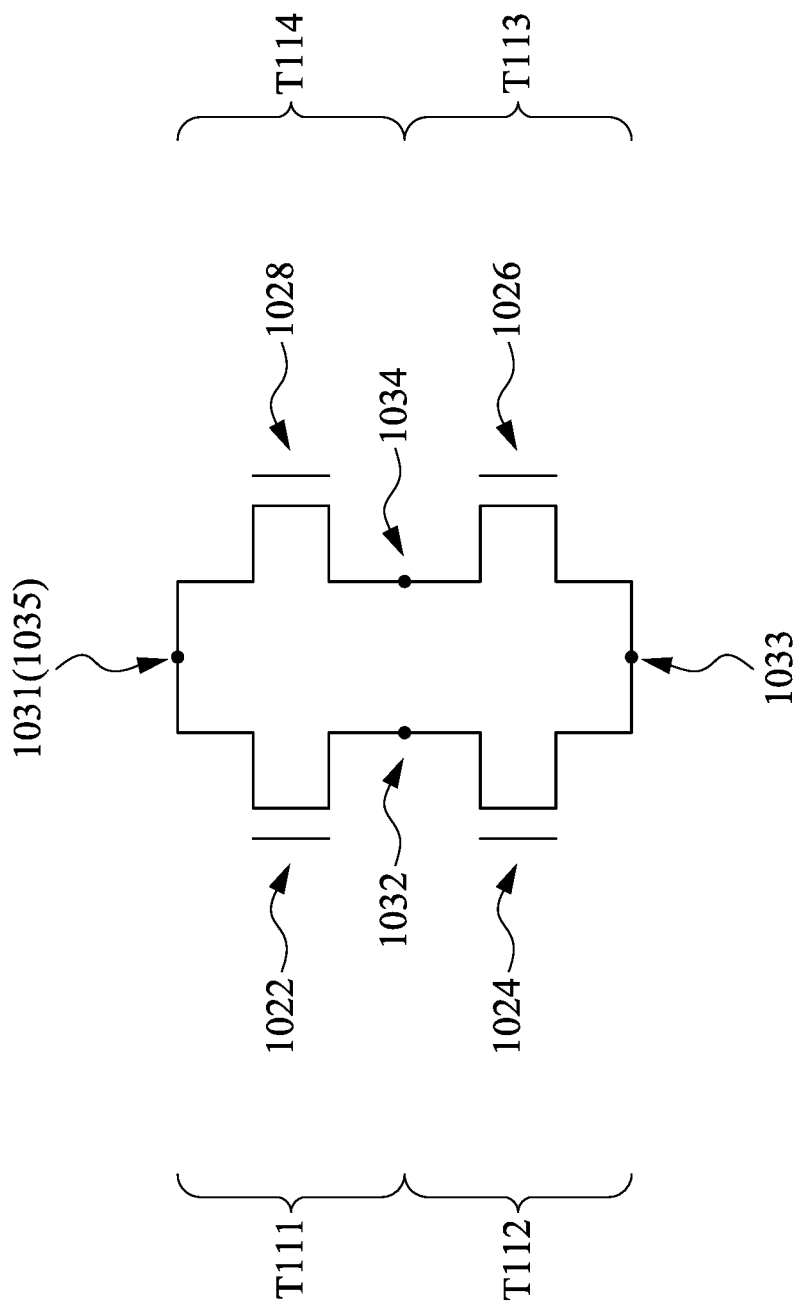
FIG. 10C illustrates an equivalent circuit of FIGS. 10A and 10B.

FIGS. 10A, 10B, and 10C illustrate an integrated circuit 100J in accordance with some embodiments of the present disclosure, in which FIG. 10A is a top view of the integrated circuit 100J, and FIG. 10B is a cross-sectional view along line B-B of FIG. 10A. FIG. 10C illustrates an equivalent circuit of FIGS. 10A and 10B. Some elements of FIGS. 10A, 10B, and 10C are similar to those described in FIGS. 1A, 1B, and 1C, and thus relevant details will not be repeated for brevity.

The integrated circuit 100J includes an active region 1014, and gate structures 1022, 1024, 1026, and 1028 disposed on the active region 1014. The integrated circuit 100J further includes source/drain regions 1031, 1032, 1033, 1034, and 1035 disposed in the active region 1014. The source/drain regions 1031 and 1032 are on opposite of the gate structure 1022, in which the gate structure 1022 and the source/drain regions 1031 and 1032 form a transistor T111. The source/drain regions 1032 and 1033 are on opposite of the gate structure 1024, in which the gate structure 1024 and the source/drain regions 1032 and 1033 form a transistor T112. The source/drain regions 1033 and 1034 are on opposite of the gate structure 1026, in which the gate structure 1026 and the source/drain regions 1033 and 1034 form a transistor T113. The source/drain regions 1034 and 1035 are on opposite of the gate structure 1028, in which the gate structure 1028 and the source/drain regions 1034 and 1035 form a transistor T114.

In some embodiments, the gate structures 1022 and 1028 have substantially the same gate length LG1, in which the gate length LG1 is a critical dimension in a corresponding technology node. On the other hand, the gate structures 1024 and 1026 have substantially the same gate length LG2. The gate length LG2 is greater than the gate length LG1. Accordingly, the transistors T111 and T114 can be referred to as a short channel device, and the transistors T112 and T113 can be referred to as a long channel device. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 ... ).

The integrated circuit 100J further includes contacts 1042 disposed on the source/drain regions 1031 and 1035, respectively, and a metal line 1052 over the contacts 1042 and electrically connecting the contacts 1042.

Figure 11A:
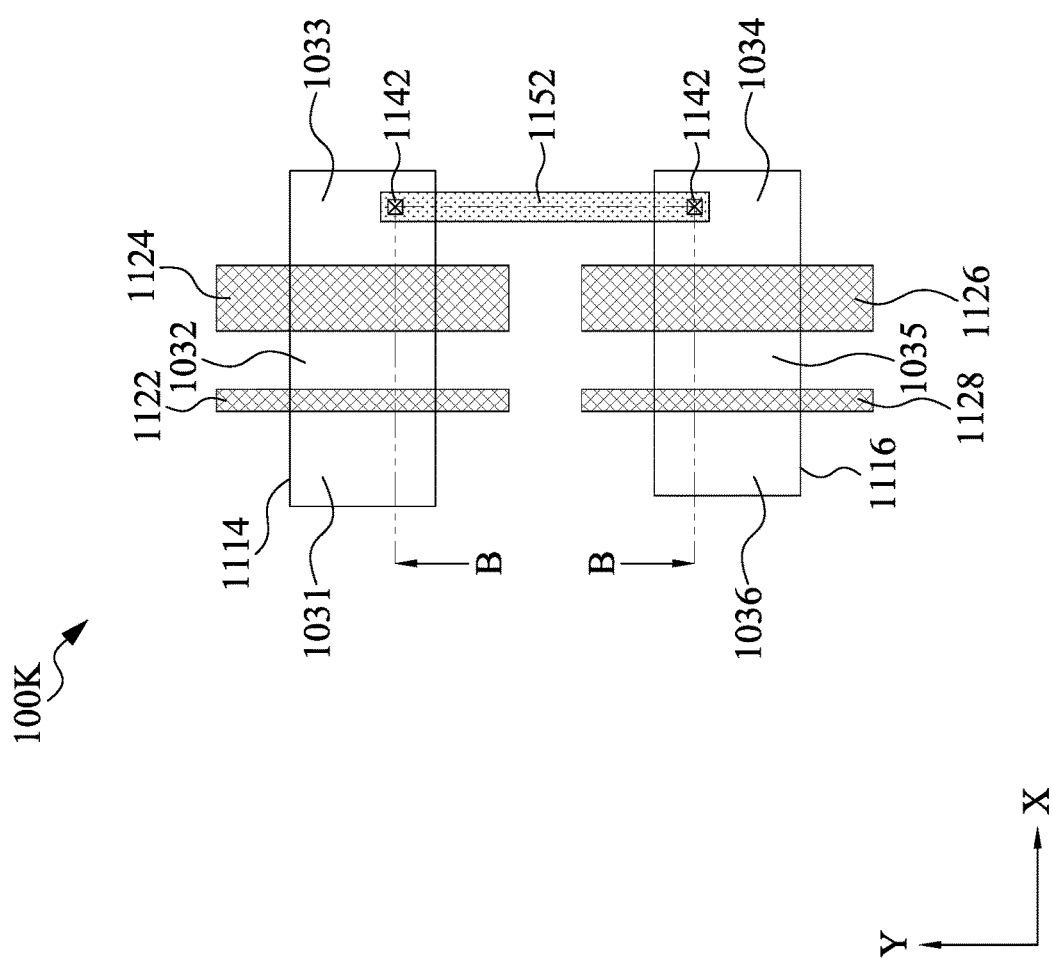
FIGS. 11A and 11B illustrate a top view and a cross-sectional view of an integrated circuit in accordance with some embodiments of the present disclosure.
Figure 11B:
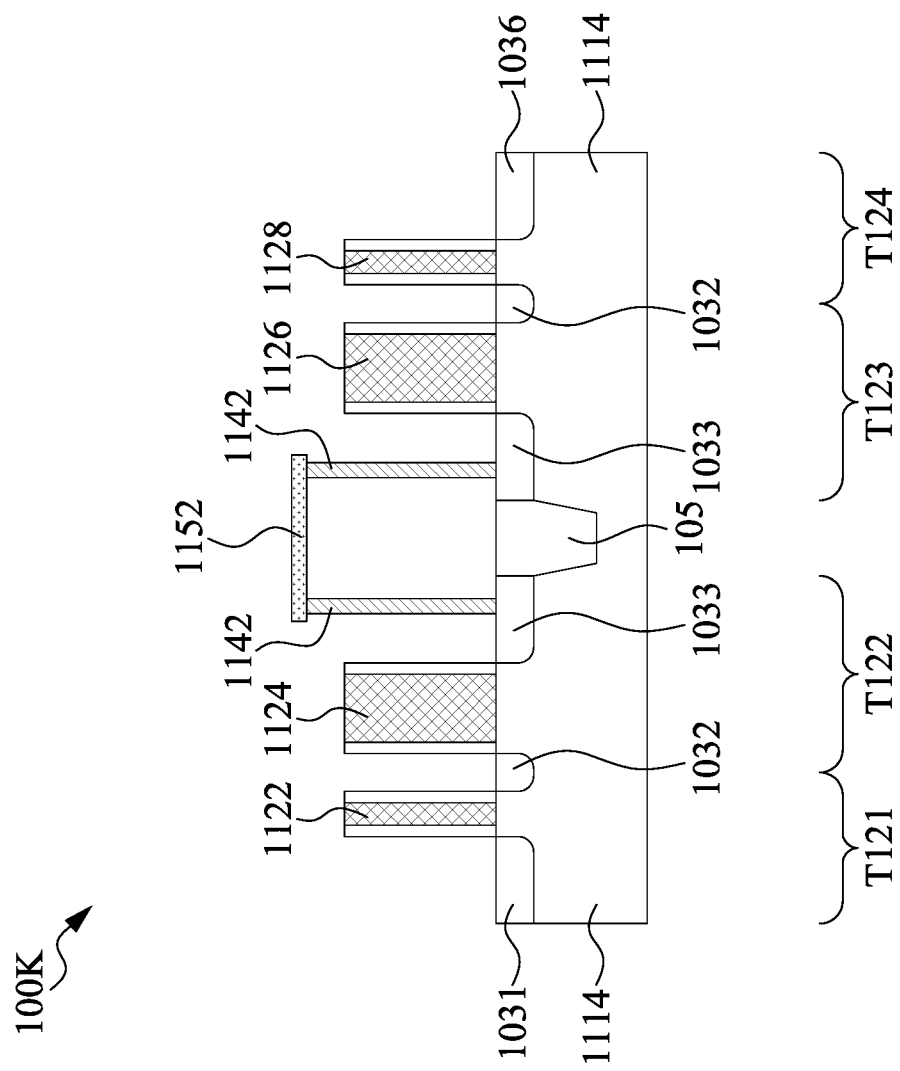
Figure 11C:
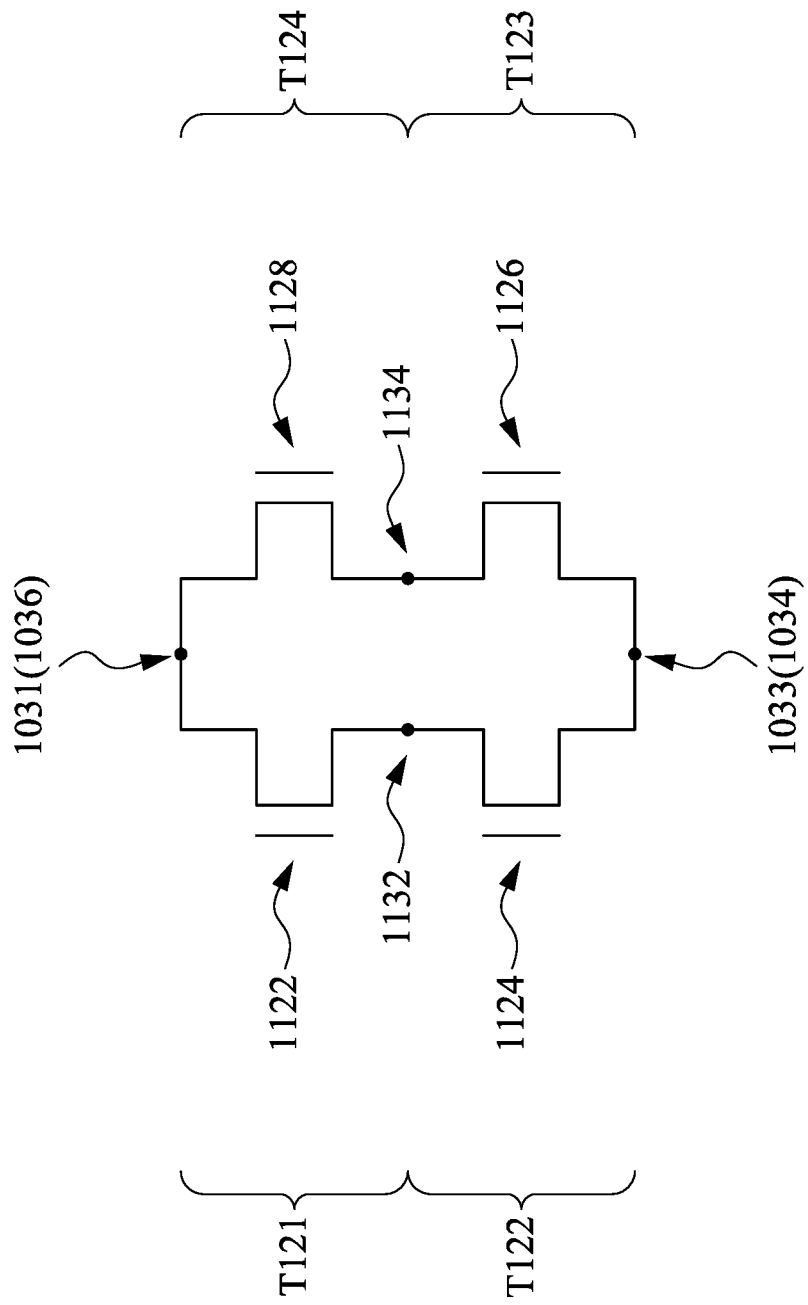
FIG. 11C illustrates an equivalent circuit of FIGS. 11A and 11B.

FIGS. 11A, 11B, and 11C illustrate an integrated circuit 100K in accordance with some embodiments of the present disclosure, in which FIG. 11A is a top view of the integrated circuit 100K, and FIG. 11B is a cross-sectional view along line B-B of FIG. 11A. FIG. 11C illustrates an equivalent circuit of the integrated circuit 100K as shown in FIGS. 11A and 11B. Some elements of FIGS. 11A, 11B, and 11C are similar to those described in FIGS. 1A, 1B, and 1C, and thus relevant details will not be repeated for brevity.

The integrated circuit 100K includes active regions 1114 and 1116 arranged along the Y direction, gate structures 1122 and 1124 disposed on the active region 1114, and gate structures 1126 and 1128 disposed on the active region 1116. The integrated circuit 100K further includes source/drain regions 1131, 1132, 1133 disposed in the active region 1114, and source/drain regions 1134, 1135, and 1136 disposed in the active region 1116. The source/drain regions 1131 and 1132 are on opposite of the gate structure 1122, in which the gate structure 1122 and the source/drain regions 1131 and 1132 form a transistor T121. The source/drain regions 1132 and 1133 are on opposite of the gate structure 1124, in which the gate structure 1124 and the source/drain regions 1132 and 1133 form a transistor T122. The source/drain regions 1134 and 1135 are on opposite of the gate structure 1126, in which the gate structure 1126 and the source/drain regions 1134 and 1135 form a transistor T123. The source/drain regions 1135 and 1136 are on opposite of the gate structure 1128, in which the gate structure 1128 and the source/drain regions 1135 and 1136 form a transistor T124.

In some embodiments, the gate structures 1122 and 1128 have substantially the same gate length LG1, in which the gate length LG1 is a critical dimension in a corresponding technology node. On the other hand, the gate structures 1124 and 1126 have substantially the same gate length LG2. The gate length LG2 is greater than the gate length LG1. Accordingly, the transistors T121 and T124 can be referred to as a short channel device, and the transistors T122 and T123 can be referred to as a long channel device. In some embodiments, the gate length LG2 is n times the gate length LG1, in which n is a positive integer. That is, LG2=n*LG1, in which n is a positive integer. In some embodiments, n is a positive integer and is greater than 1 (e.g., n=2, 3, 4 ... ).

The integrated circuit 100K further includes contacts 1142 disposed on the source/drain regions 1033 and 1034, respectively, and a metal line 1152 over the contacts 1142 and electrically connecting the contacts 1142.

Figure 12A:
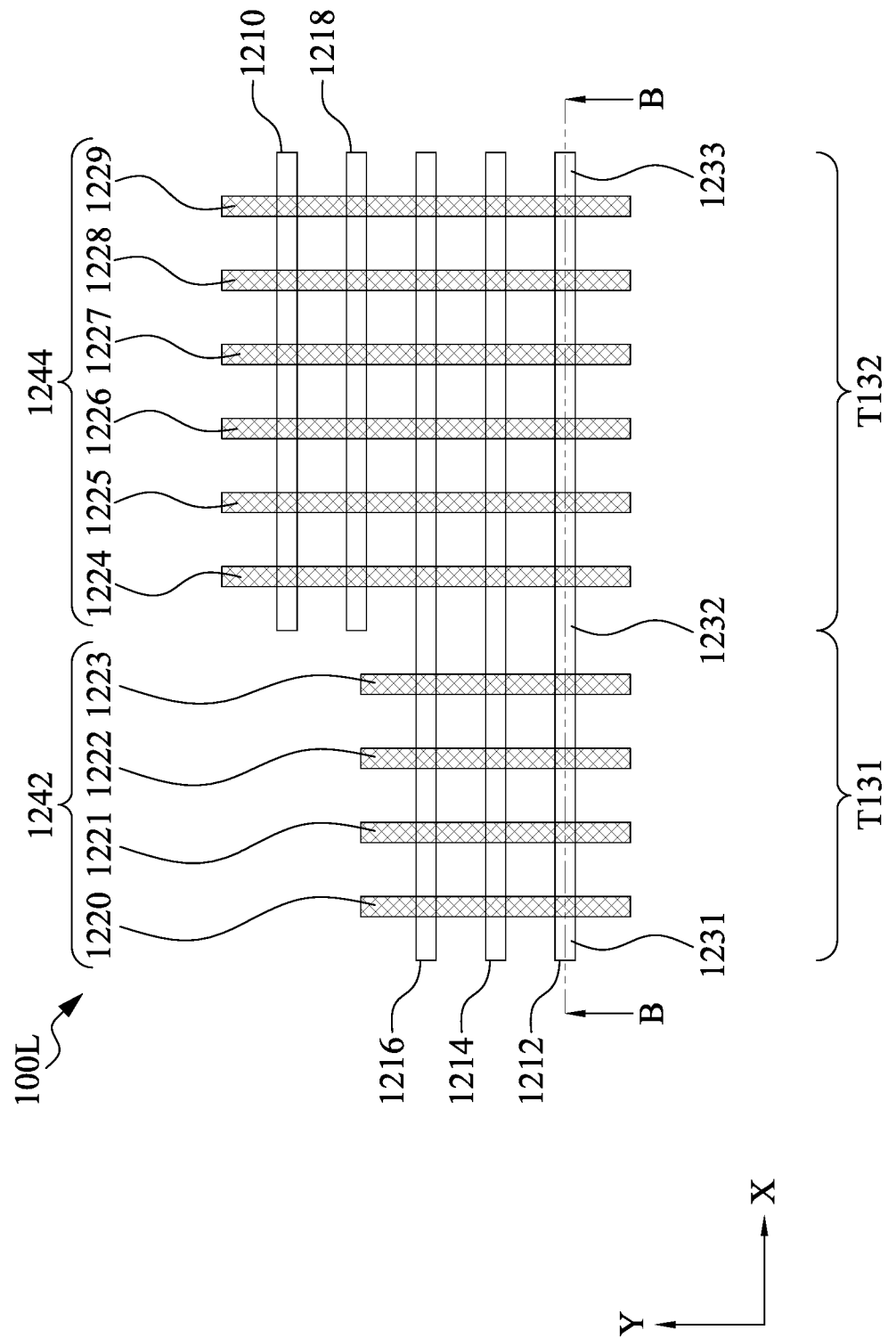
FIGS. 12A and 12B illustrate a top view and a cross-sectional view of an integrated circuit in accordance with some embodiments of the present disclosure.
Figure 12B:
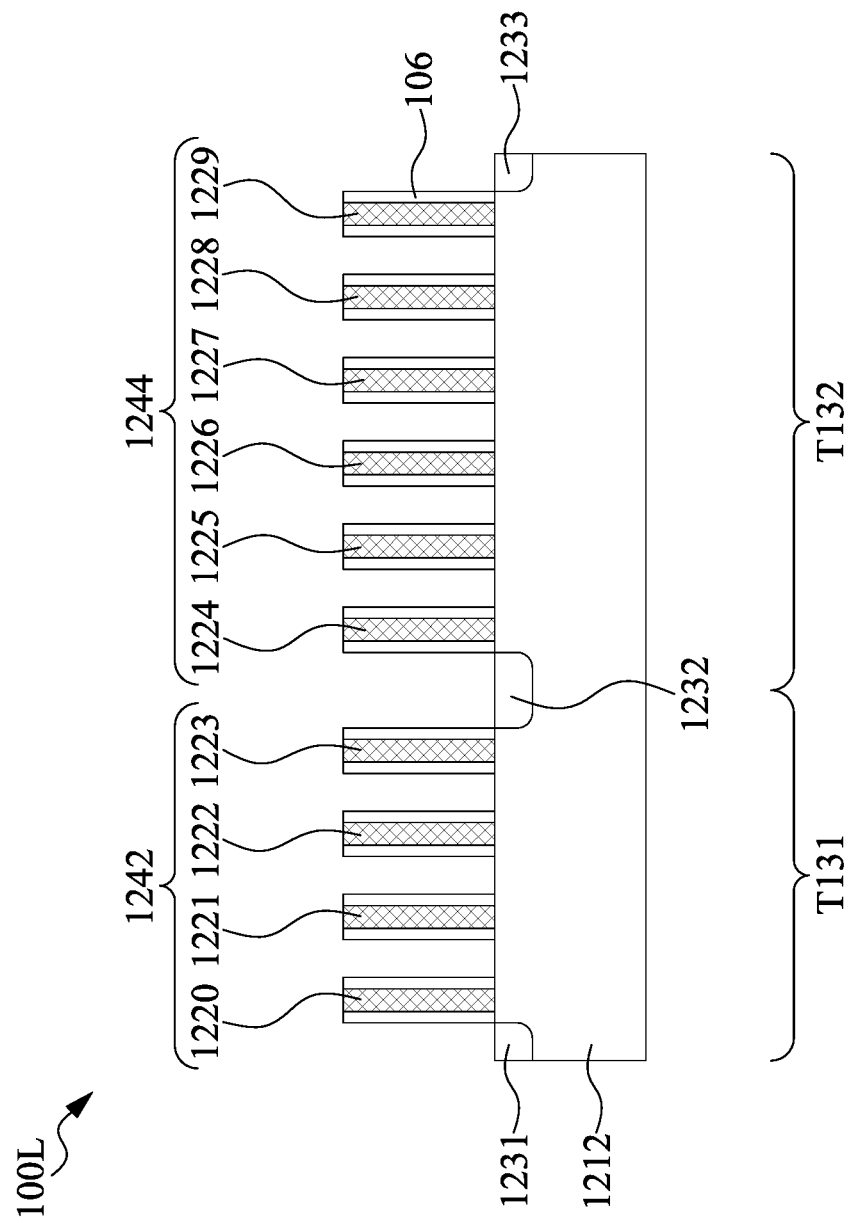
Figure 12C:
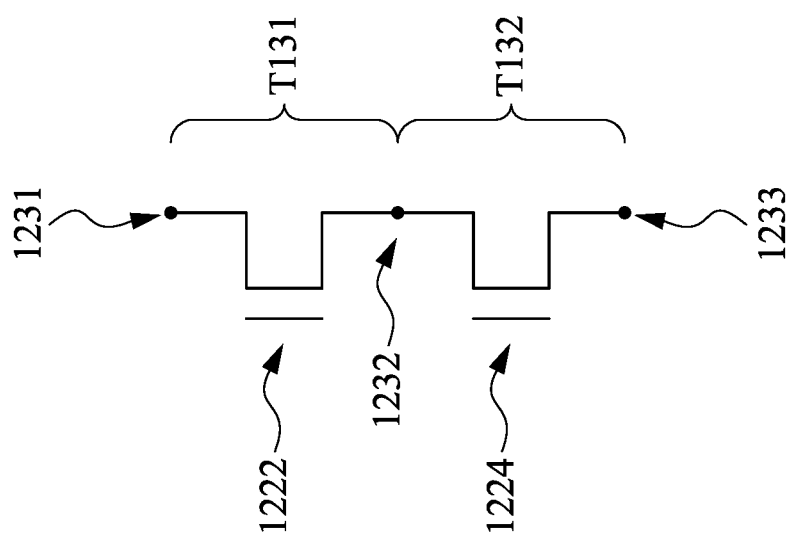
FIG. 12C illustrates an equivalent circuit of FIGS. 12A and 12B.

FIGS. 12A, 12B, and 12C illustrate an integrated circuit 100L in accordance with some embodiments of the present disclosure, in which FIG. 12A is a top view of the integrated circuit 100L, and FIG. 12B is a cross-sectional view along line B-B of FIG. 12A. FIG. 12C illustrates an equivalent circuit of FIGS. 12A and 12B. Some elements of FIGS. 12A, 12B, and 12C are similar to those described in FIGS. 1A, 1B, and 1C, and thus relevant details will not be repeated for brevity.

The integrated circuit 100L includes semiconductor fins 1211, 1212, 1213, 1214, and 1215 arranged along the Y direction. In some embodiments, along the X direction, the semiconductor fins 1211, 1212 and 1213 are longer than the semiconductor fins 1214 and 1215. The integrated circuit 100L further includes gate structures 1220, 1221, 1222, 1223, 1224, 1225, 1226, 1227, 1228, and 1229, in which the gate structures 1220, 1221, 1222, 1223 cross the semiconductor fins 1211, 1212 and 1213, and the gate structures 1224, 1225, 1226, 1227, 1228, and 1229 cross the semiconductor fins 1211, 1212, 1213, 1214, and 1215. In some embodiments, the gate structures 1220 to 1229 have substantially the same gate length LG1, in which the gate length LG1 is a critical dimension in a corresponding technology node.

The integrated circuit 100L further includes source/drain regions 1231, 1232, and 1233. In some embodiments, the source/drain regions 1231 are disposed in the semiconductor fins 1211, 1212, and 1213, and are adjacent to the gate structure 1220. The source/drain regions 1232 are disposed in the semiconductor fins 1211, 1212, 1213, 1214, and 1215, and are between the gate structures 1223 and 1225. The source/drain regions 1233 are disposed in the semiconductor fins 1211, 1212, and 1213, and are adjacent to the gate structure 1229.

In some embodiments, the gate structures 1220 to 1223 are electrically connected and can be collectively referred to as a gate 1242, in which the gate 1242 and the source/drain regions 1231 and 1232 form a transistor T131. In some embodiments, the gate structures 1220 to 1223 are electrically connected to the same voltage node. On the other hand, the gate structures 1224 to 1229 are electrically connected and can be collectively referred to as a gate 1244, in which the gate 1244 and the source/drain regions 1232 and 1233 form a transistor T132. In some embodiments, the gate structures 1224 to 1229 are electrically connected to the same voltage node. From another view point, the gate 1242 of the transistor T131 can be regarded as having several segments (e.g., gate structures 1220 to 1223) arranged along the X direction, in which each segment has spacers 106 disposed on its opposite sidewalls. As mentioned above, each of the gate structures 1220 to 1223 has a gate length LG1. Accordingly, the effective gate length of the gate 1242 of the transistor T131 is 4*LG1. For example, if the gate length LG1 is about 5 nm, the effective gate length of the gate 1242 is about 20 nm. On the other hand, each of the gate structures 1224 to 1229 has a gate length LG1. Accordingly, the effective gate length of the gate 1244 of the transistor T132 is 6*LG1. For example, if the gate length LG1 is about 5 nm, the effective gate length of the gate 1244 is about 30 nm. As a result, in the embodiment of FIGS. 12A to 12C, the transistor T131 has three semiconductor fins 1211, 1212, 1213, and the gate 1242 of the transistor T131 has four segments (e.g., the gate structures 1220 to 1223). On the other hand, the transistor T132 has five semiconductor fins 1211, 1212, 1213, 1214, and 1215, and the gate 1244 of the transistor T132 has six segments (e.g., the gate structures 1224 to 1229).

Figure 13:
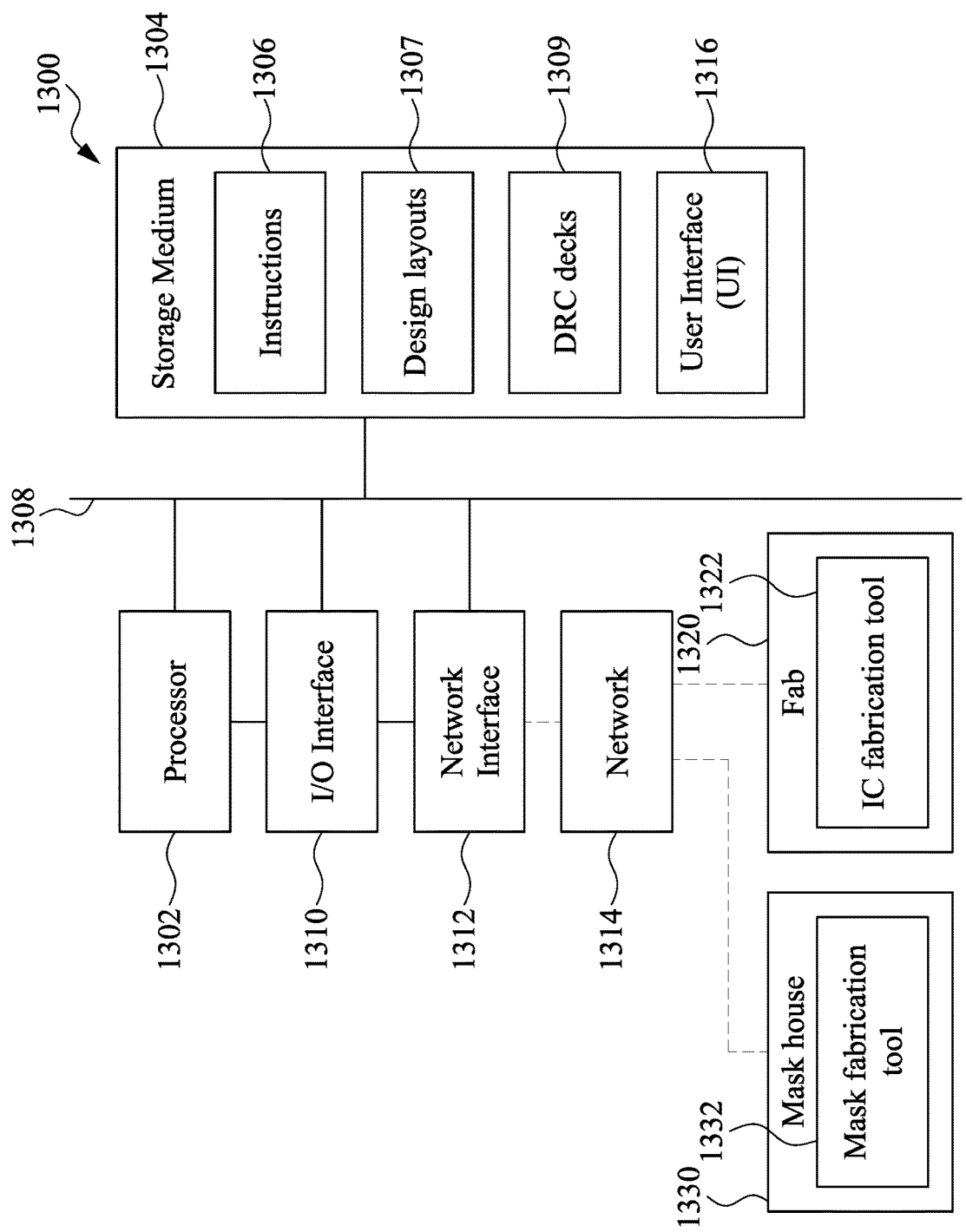
FIG. 13 is a schematic diagram of an electronic design automation (EDA) system 1300, in accordance with some embodiments of the present disclosure.

FIG. 13 is a schematic diagram of an electronic design automation (EDA) system 1300, in accordance with some embodiments. Methods described herein of generating design layouts, e.g., layout diagrams of the integrated circuits 100A, 100B, 100C, 100D, 100E, 100F, 100G, 100H, in accordance with one or more embodiments, are implementable, for example, using EDA system 1300, in accordance with some embodiments. In some embodiments, EDA system 1300 is a general purpose computing device including a hardware processor 1302 and a non-transitory, computer-readable storage medium 1304. Computer-readable storage medium 1304, amongst other things, is encoded with, i.e., stores, a set of executable instructions 1306, design layouts 1307, design rule check (DRC) decks 1309 or any intermediate data for executing the set of instructions. Each design layout 1307 comprises a graphical representation of an integrated chip (e.g., integrated circuit 100A-100H), such as for example, a GSII file. Each DRC deck 1309 comprises a list of design rules specific to a semiconductor process chosen for fabrication of a design layout 1307. Execution of instructions 1306, design layouts 1307 and DRC decks 1309 by hardware processor 1302 represents (at least in part) an EDA tool which implements a portion or all of, e.g., the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute instructions 1306 encoded in computer-readable storage medium 1304 in order to cause EDA system 1300 to be usable for performing layout design operations. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electro-magnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, computer-readable storage medium 1304 stores instructions 1306, design layouts (e.g., layouts of the integrated circuits 100A-100H discussed previously), DRC decks 1309 configured to cause EDA system 1300 (where such execution represents (at least in part) the EDA tool) to be usable for performing a portion or all of the noted processes and/or methods.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET. In one or more embodiments, a portion or all of noted processes and/or methods, is implemented in two or more EDA systems 1300.

EDA system 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a user interface (UI) 1316 through I/O interface 1310. The information is stored in computer-readable medium 1304 as UI 1316.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Also illustrated in FIG. 13 is a mask house 1330 that receives a verified layout generated from the EDA system 1300 by, for example, the network 1314. The mask house 1330 has a mask fabrication tool 1332 (e.g., a mask writer) for fabricating one or more photomasks (e.g., photomasks used for fabricating e.g., ICs 100A-100H) based on the verified layout generated from the EDA system 1300. An IC fabricator ("Fab") 1320 may be connected to the mask house 1330 and the EDA system 1300 by, for example, the network 1314. Fab 1320 includes an IC fabrication tool 1322 for fabricating IC chips (e.g., ICs 100A-100H) using the photomasks fabricated by the mask house 1330. By way of example and not limitation, the IC fabrication tool 1322 may be a cluster tool for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

In some embodiments, two or more of the EDA system 1300, the mask house 1330 and the FAB 1320 are owned by a single company. For example, two or more of the EDA system 1300, the mask house 1330 and the FAB 1320 coexist in a common facility and use common resources. In some other embodiments, the EDA system 1300 is owned by a design house, which is a different entity than the mask house 1330 and the FAB 1320. In such embodiments, each of the mask house 1330, the FAB 1320 and the design house owning the EDA system 1300 interacts with one or more of the other entities and provides services to and/or receives services from one or more of the other entities.

The integrated circuit structures as discussed above are some examples for describing the layout style with long channel device layout patterns applicable for advanced technology nodes. This concept described above can also be integrated into other semiconductor devices, such as gate-all-around (GAA) FETs and/or nanowire FETs, and can be implemented in a number of technology nodes, such as 10, 7, 5, 3 nm technology nodes.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a gate of a long-channel transistor can be divided into several segments arranged on one or more active region(s). Each of the segments may include a gate length equal to a critical dimension of a corresponding technology node or may be multiple times of the critical dimension. On the other hand, each of the segments may include different threshold voltages. This allows for a more flexible circuit layout design.

In some embodiments of the present disclosure, an integrated circuit (IC) structure includes a first transistor and a second transistor. The first transistor includes a first active region and a first gate disposed on the first active region, in which the first gate has a first effective gate length along a first direction parallel to a lengthwise direction of the first active region. The second transistor includes a second active region and a second gate disposed on the second active region, and includes a plurality of gate structures arranged along the first direction and separated from each other, in which the second gate has a second effective gate length along the first direction, the second effective gate length is n times the first effective gate length, and n is a positive integer greater than 1.

In some embodiments of the present disclosure, an IC structure includes a first transistor and a second transistor. The first transistor includes a first active region, a first gate, a plurality of gate spacers, a first source/drain region, and a second source/drain region. The first and second active regions are separated by an isolation structure, and extend along a first direction. The first gate has a plurality of gate structures disposed on the first and second active regions, respectively, in which along the first direction, an effective gate length of the gate is n times a critical dimension of a technology node of the first transistor, and n is a positive integer and is greater than 1. The gate spacers disposed adjacent each of the gate structures of the first gate. The first source/drain region is in the first active region. The second source/drain region is in the second active region. The second transistor has a gate length substantially equal to the critical dimension of the technology node of the first transistor.

In some embodiments of the present disclosure, forming a first active region and a second active region over a substrate and extending along a first direction, wherein the first active region and the second active region are separated by an isolation structure; forming a first gate structure over first active region; forming a plurality of second gate structures over the second active region, in which along the first direction, a sum of the gate lengths of the second gate structures is n times a gate length of the first gate structure, and n is a positive integer and is greater than 1; forming first source/drain regions in the first active region; and forming second source/drain regions in the second active region, wherein portions of the second active region between two adjacent second gate structures have lower dopant concentrations than the second source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first active region and a second active region over a substrate and extending along a first direction, wherein the first active region and the second active region are separated by an isolation structure;

forming a first gate structure over the first active region;

forming a plurality of second gate structures over the second active region, the plurality of second gate structures being arranged along the first direction and separated from each other, and wherein along the first direction, a sum of gate lengths of the second gate structures is n times a gate length of the first gate structure, and n is a positive integer and is greater than 1, and wherein each of the gate lengths of the second gate structures is the same as the gate length of the first gate structure, wherein the plurality of second gate structures collectively serve as a gate of a same transistor, wherein the second active region has a portion between the second gate structures, and the portion of the second active region between the second gate structures is free of a source/drain region;

forming first source/drain regions in the first active region; and forming second source/drain regions in the second active region, wherein portions of the second active region between two adjacent second gate structures have lower dopant concentrations than the second source/drain regions.

2. The method of claim 1, further comprising forming gate spacers on opposite sidewalls of the second gate structures.

3. The method of claim 1, wherein a portion of the second active region laterally between at least two of the second gate structures are un-doped.

4. The method of claim 1, wherein from a top view, the second active region is a continuous active region overlapped by the second gate structures.

5. A method for forming an integrated circuit (IC) structure, comprising:

forming a first active region and a second active region over a substrate;

forming a first gate over the first active region, wherein the first gate has a first effective gate length along a first direction parallel to a lengthwise direction of the first active region; and forming a second gate over the second active region and comprising a plurality of gate structures arranged along the first direction and separated from each other, wherein the second gate has a second effective gate length along the first direction, the second effective gate length is n times the first effective gate length, and n is a positive integer greater than 1, and wherein a first set of the gate structures of the second gate have a first gate length, the first gate length is m times the first effective gate length, a second set of the gate structures have a second gate length, the second gate length is o times the first effective gate length, wherein m and o are different positive integers, wherein the first set of the gate structures and the second set of the gate structures are of a single transistor.

6. The method of claim 5, wherein the gate structures of the second gate are electrically connected to a same voltage node.

7. The method of claim 5, further comprises forming gate spacers on opposite sidewalls of each of the gate structures of the second gate.

8. The method of claim 5, further comprises forming source/drain regions in the second active region, the source/drain regions are respectively adjacent to outmost two of the gate structures of the second gate, and portions of the second active region between outermost two of the gate structures of the second gate has a dopant concentration lower than a dopant concentration of the source/drain regions.

9. The method of claim 5, wherein along the first direction, the first set of the gate structures are not between adjacent two of the second set of the gate structures.

10. The method of claim 5, wherein the first effective gate length is a minimum gate length in the IC structure.

11. The method of claim 5, wherein the first active region comprises one or more semiconductor fins.

12. The method of claim 5, wherein the second active region comprises one or more semiconductor fins.

13. The method of claim 5, wherein there is no source/drain region between any adjacent two of the gate structures of the second gate.

14. A method for forming an integrated circuit (IC) structure, comprising:

forming a first transistor, comprising:
forming a first active region and a second active region over a substrate, wherein the first and second active regions extend along a first direction;

forming an isolation structure over the substrate and separating the first active region from the second active region;

forming a gate having gate structures disposed on the first and second active regions, respectively, wherein along the first direction, an effective gate length of the gate is n times a critical dimension of a technology node of the first transistor, and n is a positive integer and is greater than 1, wherein the gate structures are separated from each other and are electrically connected to a same voltage node, wherein the gate structures are of the same first transistor, wherein there is no source/drain region in a portion of the first active region between adjacent two of the gate structures;

forming gate spacers on sidewalls of each of the gate structures of the gate;

forming a first source/drain region in the first active region; and forming a second source/drain region in the second active region; and forming a second transistor having a gate length substantially equal to the critical dimension of the technology node of the first transistor.

15. The method of claim 14, wherein the gate structures of the first transistor have substantially a same gate length equal to the critical dimension of the technology node of the first transistor.

16. The method of claim 14, wherein at least two of the gate structures of the first transistor have different threshold voltages.

17. The method of claim 14, wherein a first set of the gate structures has a first gate length, the first gate length is m times the critical dimension of the technology node of the first transistor, a second set of the gate structures has a second gate length, and the second gate length is o times the critical dimension of the technology node of the first transistor, wherein m and o are different positive integers.

18. The method of claim 17, wherein a number of the first set of the gate structures is different from a number of the second set of the gate structures.

19. The method of claim 14, further comprising:
forming a first contact over the first active region, wherein the first contact is at a first side of the first active region, and the first source/drain region is at a second side of the first active region opposite to the first side of the first active region;

forming a second contact over the second active region, wherein the second contact is at a first side of the second active region, and the second source/drain region is at a second side of the second active region opposite to the first side of the second active region; and forming a metal line electrically connecting the first contact and the second contact.

20. The method of claim 14, wherein from a top view, the first active region is a continuous active region overlapped by the adjacent two of the gate structures.

\* \* \* \* \*